United States Patent
Cha et al.

(10) Patent No.: US 12,204,835 B2
(45) Date of Patent: Jan. 21, 2025

(54) STORAGE MEDIUM WHICH STORES INSTRUCTIONS FOR A SIMULATION METHOD IN A SEMICONDUCTOR DESIGN PROCESS, SEMICONDUCTOR DESIGN SYSTEM THAT PERFORMS THE SIMULATION METHOD IN THE SEMICONDUCTOR DESIGN PROCESS, AND SIMULATION METHOD IN THE SEMICONDUCTOR DESIGN PROCESS

(71) Applicant: SAMSUNG ELECTRONICS CO., LTD., Suwon-si (KR)

(72) Inventors: Moon Hyun Cha, Yongin-si (KR); Higashi Kotakemori, Tokyo (JP); Hiroyuki Kubotera, Kanakawa-ken (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 363 days.

(21) Appl. No.: 16/278,767

(22) Filed: Feb. 19, 2019

(65) Prior Publication Data
US 2019/0392100 A1 Dec. 26, 2019

(30) Foreign Application Priority Data

Jun. 22, 2018 (KR) .......................... 10-2018-0071962

(51) Int. Cl.
*G06F 30/3308* (2020.01)
*G06F 30/327* (2020.01)
(Continued)

(52) U.S. Cl.
CPC ........ *G06F 30/3308* (2020.01); *G06F 30/327* (2020.01); *G06F 30/33* (2020.01); *G06T 17/10* (2013.01); *G06T 17/205* (2013.01)

(58) Field of Classification Search
CPC ...... G06F 30/33; G06F 30/327; G06F 30/398; G06F 30/3308; G06T 17/205; G06T 17/10
See application file for complete search history.

(56) References Cited

U.S. PATENT DOCUMENTS 4,785,399 A * 11/1988 Evans .................. B29C 64/129
715/810
5,282,140 A * 1/1994 Tazawa .................. G06F 30/23
700/98
(Continued)

FOREIGN PATENT DOCUMENTS

CN 107526864 A 12/2017
JP 2007-280395 A 10/2007
(Continued)

OTHER PUBLICATIONS

Adalsteinsson, David, and James A. Sethian. "A fast level set method for propagating interfaces." (Academic Press, 1995) Journal of computational physics 118, No. 2 : 269-277. (Year: 1995).*

(Continued)

*Primary Examiner* — Brian S Cook
*Assistant Examiner* — Daniel E Miller
(74) *Attorney, Agent, or Firm* — Sughrue Mion, PLLC

(57) ABSTRACT

A non-transitory computer-readable storage medium stores instructions. When executed by a computer, the instructions cause the computer to perform a method for a semiconductor design simulation. The method may include generating first polygon meshes, transforming the first polygon meshes to first level sets, performing logical operations on the first level sets to generate second level sets, and transforming the second level sets to second polygon meshes.

19 Claims, 24 Drawing Sheets

(51) Int. Cl.
  *G06F 30/33* (2020.01)
  *G06T 17/10* (2006.01)
  *G06T 17/20* (2006.01)

(56) References Cited

U.S. PATENT DOCUMENTS

| | | | | |
|---|---|---|---|---|
| 6,943,789 | B2* | 9/2005 | Perry | G06T 17/20 |
| | | | | 345/420 |
| 7,027,045 | B2* | 4/2006 | Perry | G06T 17/10 |
| | | | | 345/419 |
| 7,542,036 | B2 | 6/2009 | Museth et al. | |
| 7,565,276 | B2 | 7/2009 | Song et al. | |
| 7,589,720 | B2 | 9/2009 | Zhou et al. | |
| 7,703,068 | B2* | 4/2010 | Abrams | G03F 1/36 |
| | | | | 716/54 |
| 8,832,620 | B1* | 9/2014 | Fried | G06F 30/398 |
| | | | | 716/110 |
| 9,430,870 | B2* | 8/2016 | Museth | G06T 19/20 |
| 9,477,798 | B1* | 10/2016 | Guoy | G06F 30/23 |
| 9,846,260 | B2 | 12/2017 | Mallet | |
| 10,083,264 | B1* | 9/2018 | Orbay | G06F 30/17 |
| 10,197,908 | B2 | 2/2019 | Sriraman et al. | |
| 2004/0170302 | A1* | 9/2004 | Museth | G06T 19/20 |
| | | | | 382/107 |
| 2005/0128195 | A1* | 6/2005 | Houston | G06T 15/08 |
| | | | | 345/419 |
| 2007/0239413 | A1 | 10/2007 | Yu | |
| 2017/0124431 | A1 | 5/2017 | Jung et al. | |
| 2018/0276316 | A1* | 9/2018 | Brochu | G06T 17/10 |
| 2019/0134915 | A1* | 5/2019 | Schmidt | G05B 19/4099 |
| 2021/0181620 | A1* | 6/2021 | Poonawala | G06N 3/08 |

FOREIGN PATENT DOCUMENTS

| | | | |
|---|---|---|---|
| JP | 5792502 B2 | 10/2015 | |
| JP | 5946628 B2 | 7/2016 | |
| KR | 20160024738 A | 3/2016 | |

OTHER PUBLICATIONS

Botsch, Mario, Leif Kobbelt, Mark Pauly, Pierre Alliez, and Bruno Lévy. Polygon mesh processing. (CRC press, 2010) pp. 1-6. ISBN: 978-1-4398-6531-6 (Year: 2010).*

Pasko, Alexander, Valery Adzhiev, Alexei Sourin, and Vladimir Savchenko. "Function representation in geometric modeling: concepts, implementation and applications." (Springer, 1995) The visual computer 11, No. 8: 429-446. https://doi.org/10.1007/BF02464333 (Year: 1995).*

Montoliu Álvaro, C. "Study, Modelling and Implementation of the Level Set Method Used in Micromachining Processes" (UPV, 2015) Doctoral Thesis. Universitat Politècnica de València. https://doi.org/10.4995/Thesis/10251/58609 (Year: 2015).*

Klemenschits, Xaver, Siegfried Selberherr, and Lado Filipovic. "Modeling of gate stack patterning for advanced technology nodes: A review." (2018, MDPI) Micromachines 9, No. 12: 631. https://doi.org/10.3390/mi9120631 (Year: 2018).*

Ertl, O. "Numerical methods for topography simulation" Dissertation. (reposiTUm, 2010). https://doi.org/10.34726/hss.2010.001 ( Year: 2010).*

Breitfelder, Kim, and Don Messina. "IEEE 100: the authoritative dictionary of IEEE standards terms." Standards Information Network IEEE Press. Seventh Edition (2000). p. 686. ISBN 0-7381-2601-2 (Year: 2000).*

Upreti, K., 2014. Algebraic level sets for CAD/CAE integration and moving boundary problems (Doctoral dissertation, Purdue University). (Year: 2014).*

Yoon, Sangho, Ohseob Kwon, Sukin Yoon, Hyunsu Jung, and Taeyoung Won. "A mesh generation algorithm for complex geometry [semiconductor process modelling]." In 2000 International Conference on Simulation Semiconductor Processes and Devices (Cat. No. 00TH8502), pp. 218-221. IEEE, 2000. (Year: 2000).*

Ertl, Otmar, and Siegfried Selberherr. "A fast level set framework for large three-dimensional topography simulations." Computer Physics Communications 180, No. 8 (2009): 1242-1250. (Year: 2009).*

Zhang, Yongjie, and Chandrajit Bajaj. "Adaptive and quality quadrilateral/hexahedral meshing from volumetric data." Computer methods in applied mechanics and engineering 195, No. 9-12 (2006): 942-960. (Year: 2006).*

Korean Intellectual Property Office Written Opinion for Application 10-20 18-00 7 19 62 filed Oct. 26, 2022 (Year: 2022).*

Korean Intellectual Property Office Written Opinion for Application 10-20 18-00 7 19 62 filed Mar. 28, 2023 (Year: 2023).*

Korean Intellectual Property Office Written Opinion for Application 10-20 18-00 7 19 62 filed May 22, 2023 (Year: 2023).*

Whitaker, Ross T. "A level-set approach to 3D reconstruction from range data." International journal of computer vision 29 (1998): 203-231. (Year: 1998).*

Otmar Ertl et al., "A fast level set framework for large three-dimensional topography simulations. Computer Physics Communications" Computer Physics Communications 180 (2009) 1242-1250.

Dan Wake et al., "A Hybrid Mesh Generation Method for Two and Three Dimensional Simulation of Semiconductor Processes and Devices", Article, May 2000, www.researchgate.net/publication/2629886.

Korean Notice of Allowance Dated Sep. 5, 2023, Cited in Corresponding Korean Patent Application.

* cited by examiner

210

220

230

240

250

STORAGE MEDIUM WHICH STORES INSTRUCTIONS FOR A SIMULATION METHOD IN A SEMICONDUCTOR DESIGN PROCESS, SEMICONDUCTOR DESIGN SYSTEM THAT PERFORMS THE SIMULATION METHOD IN THE SEMICONDUCTOR DESIGN PROCESS, AND SIMULATION METHOD IN THE SEMICONDUCTOR DESIGN PROCESS

CROSS-REFERENCE TO RELATED APPLICATIONS

This U.S. non-provisional patent application claims priority under 35 U.S.C. § 119 to Korean Patent Application No. 10-2018-0071962, filed on Jun. 22, 2018 in the Korean Intellectual Property Office, the entire contents of which are hereby incorporated by reference.

BACKGROUND

1. Technical Field

The present disclosure relates to electronic digital processing technology. More particularly, the present disclosure relates to a storage medium which stores instructions for a simulation method in a semiconductor design process, a semiconductor design system that performs the simulation method in the semiconductor design process, and a method of performing a simulation in a semiconductor design process to design a semiconductor device.

2. Description of Related Art

Various tools are used to design a semiconductor device. Design tools include a technology computer-aided design (TCAD) program. The TCAD program can be used to simulate a semiconductor device, can be used to perform a simulation method in a semiconductor design process, and can be used to simulate a circuit of a semiconductor device.

In the TCAD-based simulation, polygon meshes are used to construct a model for a two-dimensional or three-dimensional shape of a semiconductor material constituting the semiconductor device as a constructed model. Thereafter, additional simulation steps may be executed to simulate deposition, etching, and patterning processes to be performed on the constructed model. As a result, a shape of the model may be changed.

Due to the change in shape of the constructed model, the polygon meshes in the constructed model may be modified by the TCAD. For example, an operation, called "constructive solid geometry" (CSG), may be performed to modify the polygon meshes in the constructed model. The CSG operation may include a re-meshing operation or a re-triangulation operation. The re-meshing operation may involve generating a re-constructed (new) mesh based on the original constructed mesh by modifying the sampling and connectivity of the polygon meshes in the original constructed mesh. The re-triangulation operation may involve systematically adjusting vertices of the polygon meshes of the original constructed model.

An increase in complexity of the original model may result in an increase of the number of the polygon meshes and an increase in amount of computation required for the CSG operation. As an integration density and complexity of a semiconductor device increase, it is necessary to develop an apparatus or method capable of reducing an amount of computation required for the CSG operation.

SUMMARY

Some embodiments of the present disclosure provide a storage medium which stores instructions for a simulation method in a semiconductor design process to design a semiconductor device, a semiconductor design system that performs a simulation method in a semiconductor design process to design a semiconductor device, and a method of performing a simulation method in a semiconductor design process to design a semiconductor device. Here, the instructions are prepared to reduce an amount of required computation and the consequent operation time.

According to some embodiments of the present disclosure, a non-transitory computer-readable storage medium stores instructions. When executed by a computer, the instructions cause a computer to perform a method for a semiconductor design simulation. The method may include generating first polygon meshes, transforming the first polygon meshes to first level sets, performing logical operations on the first level sets to generate second level sets, and transforming the second level sets to second polygon meshes.

According to some embodiments of the present disclosure, a semiconductor design system may include a non-transitory computer-readable storage medium that stores instructions and a processor configured to execute the instructions, thereby performing a method for a semiconductor design simulation. The method may include generating first polygon meshes, transforming the first polygon meshes to first level sets, performing logical operations on the first level sets to generate second level sets, and transforming the second level sets to second polygon meshes.

According to some embodiments of the present disclosure, a non-transitory computer-readable storage medium stores instructions. When executed by a computer, the instructions cause a computer to perform a method for a semiconductor design simulation. The method may include forming a first body and a second body using first polygon meshes, calculating a first level set from first surfaces formed by the first body and the second body, removing the first body, and calculating a second level set from a second surface of the second body.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present disclosure will now be described more fully with reference to the accompanying drawings, in which example embodiments are shown.

Figure 1:
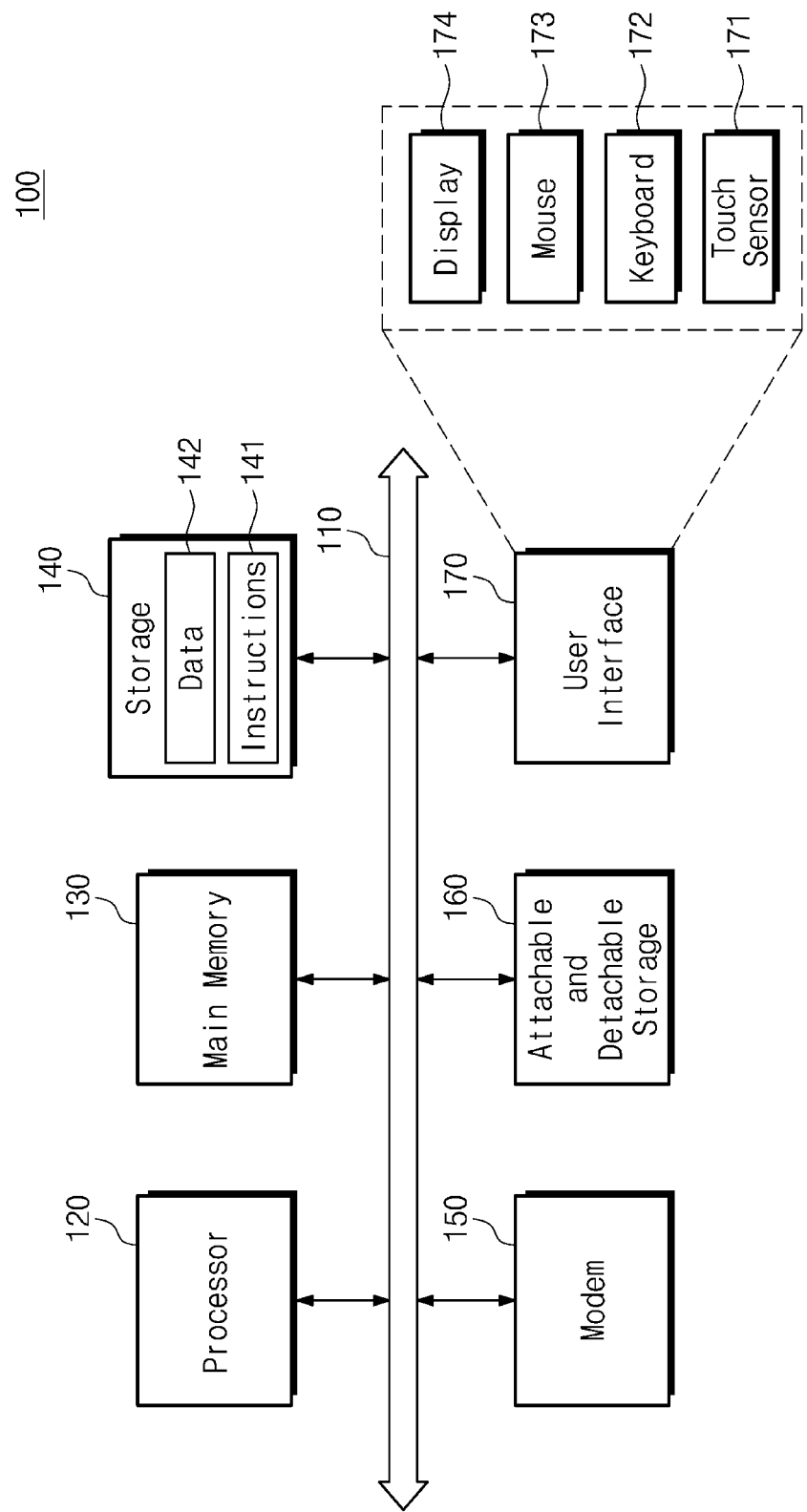
FIG. 1 illustrates a semiconductor design system according to some embodiments of the present disclosure.

FIG. 1 illustrates a semiconductor design system 100 according to some embodiments of the present disclosure. Referring to FIG. 1, the semiconductor design system 100 may include a bus 110, a processor 120, a main memory 130, a storage 140, a modem 150, an attachable and detachable storage 160, and a user interface 170.

The bus 110 may provide a channel between elements constituting the semiconductor design system 100. The processor 120 may be used to control the semiconductor design system 100 and to perform a simulation method in a semiconductor design process for designing a semiconductor device. For example, the processor 120 may execute instructions 141, which are stored in the storage 140, thereby running a tool (hereinafter, a simulation tool) that is prepared to simulate a semiconductor device.

The processor 120 may read data stored in the storage 140 including that can be used to generate a semiconductor model for simulation. The processor 120 may generate a semiconductor model from the data using the tool and may perform various simulation methods and processes on the semiconductor model.

The main memory 130 may be used as an operation memory of the processor 120. The main memory 130 may temporarily store instructions and/or data, which are needed by the processor 120, among the instructions 141 and data 142 stored in the storage 140. The main memory 130 may include a high-speed random-access memory (e.g., DRAM, PRAM, MRAM, and RRAM) or a storage class memory (SCM).

The storage 140 may be used as a secondary memory of the semiconductor design system 100. The storage 140 may be used to store the instructions 141, which constitute the simulation tool for simulating a semiconductor device, and the data 142, which will be used to generate the semiconductor model that is a subject of the simulation method in the semiconductor design process. The storage 140 may include a hard disk drive (HDD), a solid-state drive (SSD), an optical disk drive (ODD), and so forth.

The modem 150 may be configured to communicate with an external device in a wired or wireless manner. For example, the instructions 141 and/or the data 142 may be transferred to the storage 140 from an external device through the modem 150 and may be stored in the storage 140. The instructions 141 and/or the data 142 stored in the storage 140 may be transferred to an external device through the modem 150. The modem 150 may be based on the Ethernet protocol.

The attachable and detachable storage 160 may include a portable storage. The instructions 141 and/or the data 142 may be moved or transferred, for example, from the attachable and detachable storage 160 to the storage 140. The instructions 141 and/or the data 142 stored in the storage 140 may be moved or transferred to the attachable and detachable storage 160. The attachable and detachable storage 160 may be based on one of various standards, such as, a universal serial bus (USB) or a serial advanced technology attachment (SATA).

The user interface 170 may include various user input interfaces, such as, a touch sensor 171, a keyboard 172, and a mouse 173. The user interface 170 may receive execution instructions of the simulation tool and various instructions for simulation functions of the tool from a user.

The user interface 170 may include various user output interfaces (e.g., a display 174). The user interface 170 may be used to transfer the semiconductor model, which is a subject of the simulation method in the semiconductor design process, and a process and a result of the simulation method in the semiconductor design process on the semiconductor model, to a user.

As an example, the semiconductor design system 100 may be implemented as a general-purpose computer or as a special-purpose computer for the semiconductor simulation method in the semiconductor design process. The simulation tool for simulating a semiconductor device may be transferred in the form of the instructions 141 through the modem 150 or through the attachable and detachable storage 160. The semiconductor model for the semiconductor simulation method in the semiconductor design process may be transferred in the form of the data 142 through the modem 150 or through the attachable and detachable storage 160.

Figure 2:
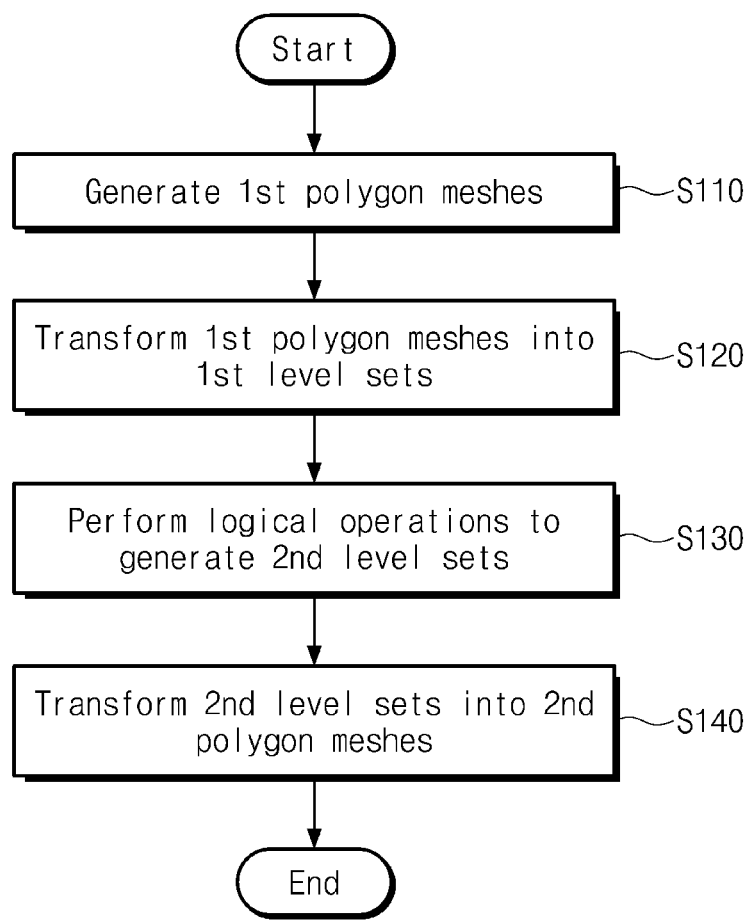
FIG. 2 is a flow chart illustrating a simulation method according to some embodiments of the present disclosure.

FIG. 2 is a flow chart illustrating a simulation method according to some embodiments of the present disclosure. The method shown in FIG. 2 may be performed by the simulation tool that is activated when the instructions 141 of the storage 140 are run by the processor 120. Referring to FIGS. 1 and 2, in step S110, the simulation tool may generate first polygon meshes from the data 142 stored in the storage 140. The first polygon meshes may form a semiconductor model.

In step S120, the simulation tool may transform the first polygon meshes to first level sets. Each of the first level sets may include distance value sets. Each of the distance value sets may include values with signs. The number of values in each of the distance value sets may be determined depending on a dimension of the first polygon meshes. For example, the number of values in each of the distance value sets may be equal to the dimension of the first polygon meshes. Accordingly, a first level set or any other level set described herein may include sets of information defining relationships between polygon meshes and distances and values. As described herein, the distances and values may be distances and values from surfaces of the semiconductor model to coordinates in a coordinate system closest to any surface of the semiconductor model.

In step S130, the simulation tool may generate second level sets through logical operations on the first level sets. The second level sets may be similar in nature to the type of data 142 used originally to generate the first level meshes. For example, the simulation tool may perform the same logical operation on each of the first level sets. The logical operation may include a Boolean operation such as one (or more than one) of union, intersection and difference. The logical operation may correspond to a process that is applied to the semiconductor model, such as a process of adding a body to a semiconductor model, removing a body from a semiconductor model, or reducing a size of the semiconductor model.

In step S140, the simulation tool may transform the second level sets to second polygon meshes. The second polygon meshes may form a semiconductor model, to which a process is applied. The steps S110 to S140 may form a constructive solid geometry (CSG) operation.

According to some embodiments of the present disclosure, the step of applying the process to the polygon meshes may be performed by a simple logical operation of transforming the values in the first level sets to the values in the second level sets. An operation or operations associated with the polygon meshes may be limited to the step S110 of generating the first polygon meshes and the step S140 of generating the second polygon meshes.

In a re-meshing or re-triangulation method performing the operation on the polygon meshes, the shapes of the polygon meshes may be reconstructed or adjusted in consideration of a change in shape of the semiconductor model, while maintaining existing polygon meshes, as the overall existing polygon meshes or some, most or all of the individual existing polygon meshes.

Here, since the existing polygon meshes are considered in the operation, an amount of computation required for the operation may be large.

Steps S110 and S140 may correspond to an initial meshing and may generate new polygon meshes from the shape of the semiconductor model. In step S140, the second polygon meshes may be generated independent of the first polygon meshes generated in the step S110.

The steps S110 and S140 may be performed in a simple manner, compared with the re-meshing or re-triangulation, and thus, it may be possible to reduce an amount of computation required for the CSG operation and to reduce an operation time for the CSG operation.

Figure 3:
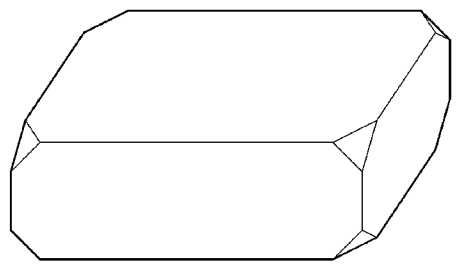
FIG. 3 illustrates an example of a semiconductor model, which is represented by data stored in a storage.

FIG. 3 illustrates an example of a semiconductor model, which is represented by the data 142 stored in the storage 140. Referring to FIGS. 1 and 3, the data 142 may represent a semiconductor model having hexagonal large surfaces and triangular small surfaces.

Figure 4:
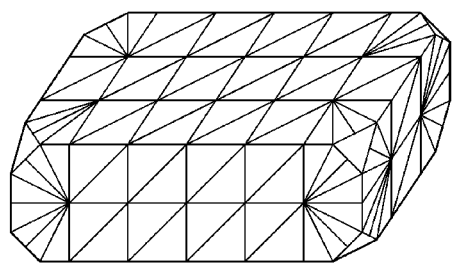
FIG. 4 illustrates an example of polygon meshes in a semiconductor model.

FIG. 4 illustrates an example of polygon meshes in a semiconductor model. Referring to FIGS. 3 and 4, triangular polygon meshes may be generated to cover surfaces of a body in the semiconductor model. For example, the body may be defined to have independent surfaces, which are defined by polygon meshes. Various terms, such as a solid, an object, and a subject, may be used to refer to the body, but the teachings of the present disclosure are not limited to a specific term.

Figure 5:
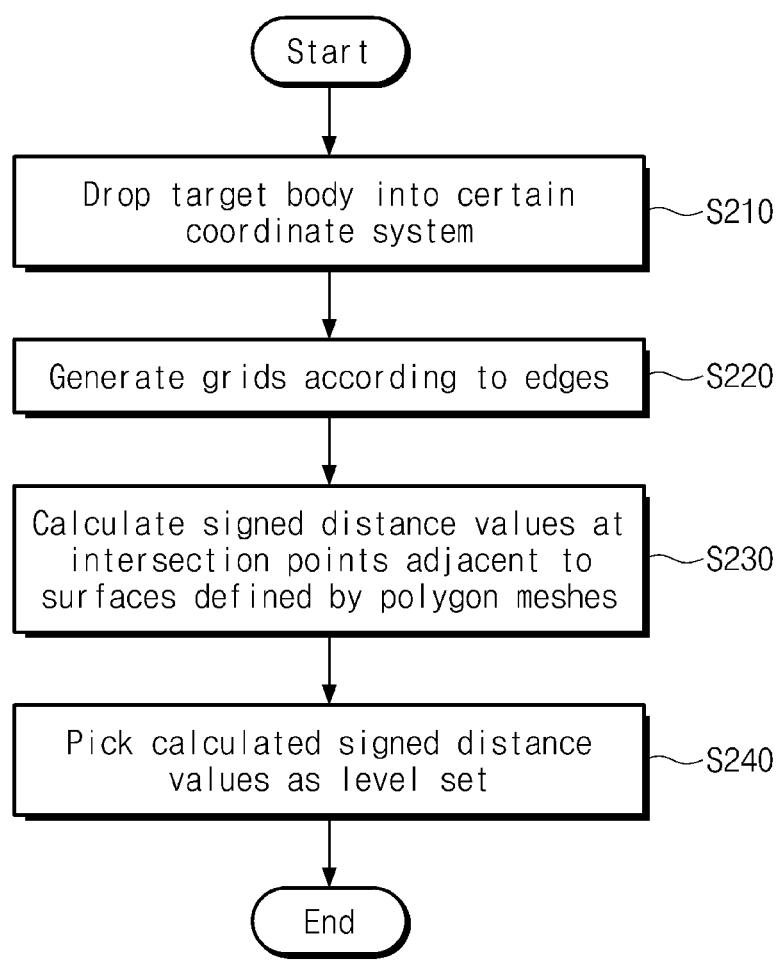
FIG. 5 is a flow chart illustrating a method of generating a level set from the semiconductor model of FIG. 4.
Figure 6:
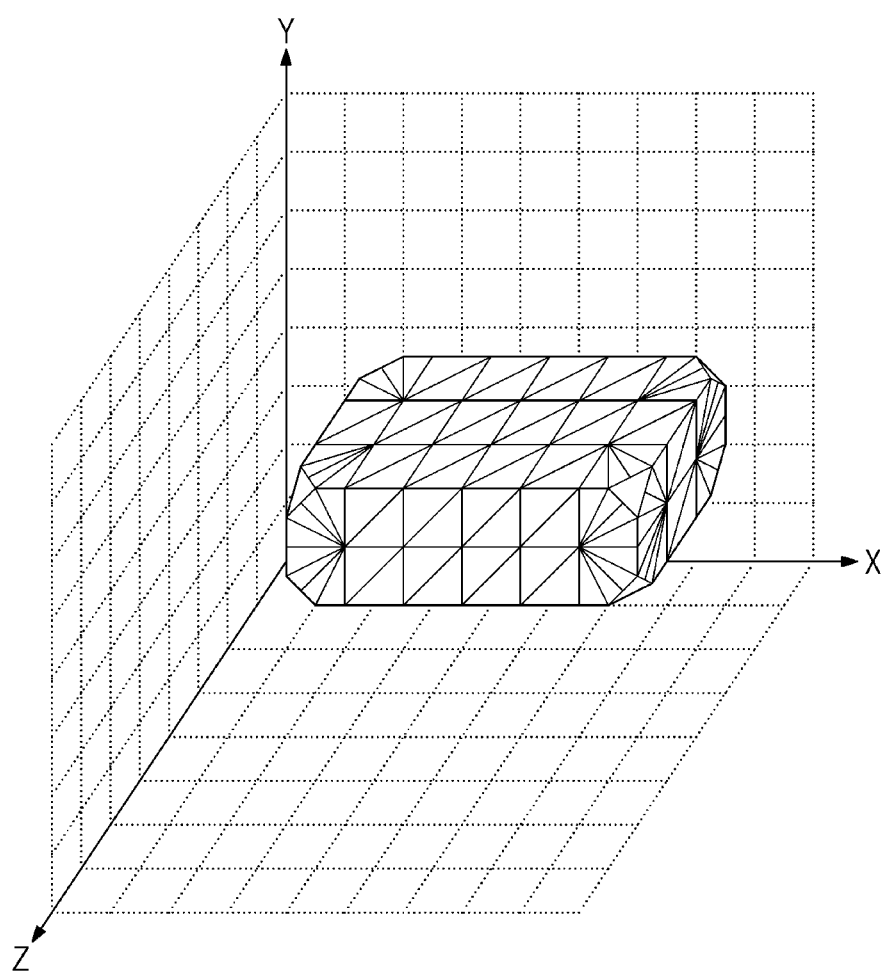
FIG. 6 illustrates an example of a target body of FIG. 4 that is placed in a certain coordinate system.

FIG. 5 is a flow chart illustrating a method of generating a level set from the semiconductor model of FIG. 4. The method shown in FIG. 5 may be performed by the simulation tool that is activated when the instructions 141 of the storage 140 are run by the processor 120. Referring to FIGS. 1, 4, and 5, in step S210, the simulation tool may drop or place a target body in a certain coordinate system. FIG. 6 is explained below, and shows an example of the target body of FIG. 4 that is placed (or dropped) in a certain coordinate system.

For example, the simulation tool may define the certain coordinate system, which is virtually placed around the target body. A dimension of the certain coordinate system may be equal to the dimension of the polygon meshes constituting the target body.

In step S220, the simulation tool may generate grids along edges, which are formed by the polygon meshes of the target body. For example, in the simulation tool, the grids may be generated along the edges and around the target body, and here, a shape of each of the grids may be determined depending on the kind of the certain coordinate system. That is, transforming of (first) polygon meshes to (first) level sets may include constructing grids in a specified coordinate system to allow a target body, which is formed by the (first) polygon meshes, to be placed in grids.

In step S230, the simulation tool may calculate signed distance values, in which information on the polygon meshes is contained, at intersection points of the grids, which are located adjacent to the surfaces of the target body defined by the polygon meshes. That is, transforming of (first) polygon meshes to (first) level sets may also include calculating distance values at selected intersection points, which are positioned adjacent to surfaces of the target body, among intersection points of the grids. In step S240, the simulation tool may pick signed distance values (or sets of signed distance values) as a level set. That is, transforming of (first) polygon meshes to (first) level sets may further include picking the distance values as one set of the first level sets.

FIG. 6 illustrates an example of the target body of FIG. 4 that is placed in a certain coordinate system. The certain coordinate system may be, for example, a rectangular coordinate system that is placed around the target body and is defined by three orthogonal axes (e.g., a first axis X, a second axis Y, and a third axis Z). In the rectangular coordinate system, grids may be generated around the target body. For example, the grids may be generated to pass through some of the edges of the target body.

Figure 7:
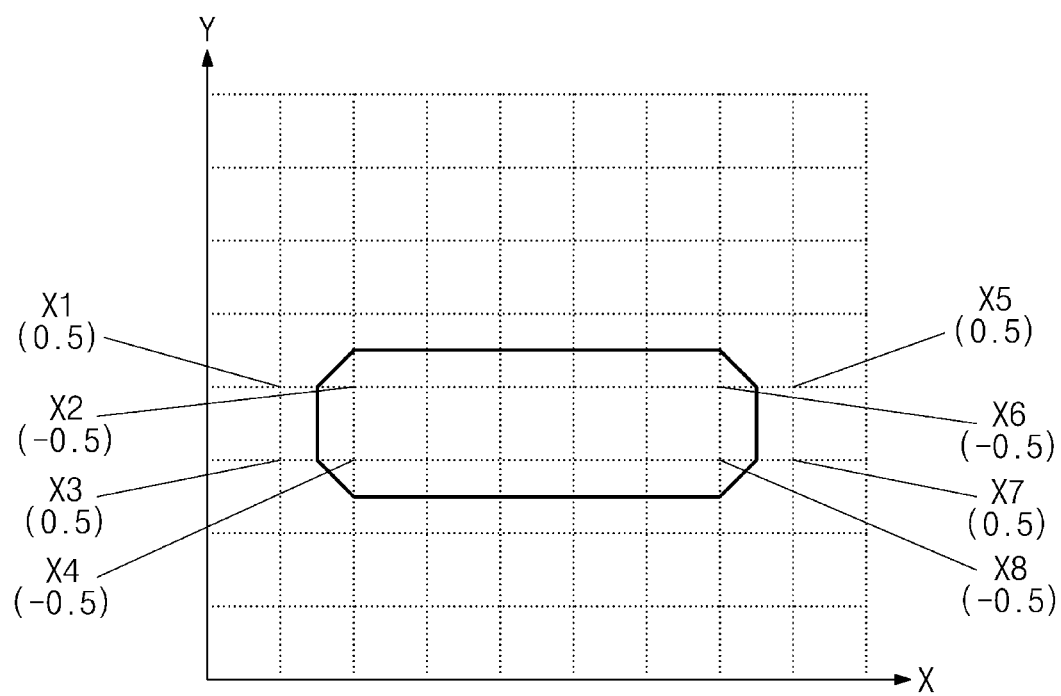
FIG. 7 illustrates signed distance values that are exemplarily calculated at intersection points of grids located near the target body.

FIG. 7 illustrates signed distance values that are exemplarily calculated at some intersection points of the grids located near the target body. That is, distance values calculated at selected intersection points may be or include point-based distance values, which are obtained at each of the selected intersection points. To reduce complexity in the drawings and the description, FIG. 7 illustrates an example, in which, for the target body of FIG. 6, signed distance values are calculated on a single large surface.

For example, the signed distance values may be calculated at some selected intersection points, which are located adjacent to a surface of the target body, among the intersection points of the grids. The distance value may represent a distance from a selected intersection point to the surface of the target body. For example, the distance value may represent a distance from a selected intersection point to the nearest surface of the target body. That is, the distance values may be or include point-based distance values, which are obtained at a specific intersection point and represent shortest distances from the specific intersection point to the surfaces of the target body in the coordinate system. The distance value may be calculated in a direction parallel to the first axis X, the second axis Y, or the third axis Z. For example, some examples of distance values calculated along the first axis X are illustrated in FIG. 7.

A distance value between the intersection point and the target body may be given within a range from 0.0 to 1.0. In the case where the intersection point is in contact with the surface of the target body, the distance value may be 0.0. In the case where a distance between an intersection point and the target body has the largest value, the surface of the target body may be in contact with another intersection point adjacent thereto, and in this case, the distance value may be 1.0. Notably, in FIG. 7 there are no instances where the surface of the target body is in contact with any intersection point, so no distance values are 1.0, 2.0, 3.0 or −1.0, −2.0, −3.0.

The sign of the distance value may be determined depending on whether a selected intersection point is located within or outside the target body. For example, in the case where a selected intersection point is located within the target body, the distance value may have a negative sign. By contrast, in the case where a selected intersection point is located outside the target body, the distance value may have a positive sign.

When calculated in the direction parallel to the first axis X, a distance between a first intersection point X1 and the surface of the target body may be 0.5. Since the first intersection point X1 is located outside the surface of the target body, the distance value may have a positive sign. Thus, when calculated in the direction parallel to the first axis X, a distance value of the first intersection point X1 may be given as '0.5'.

When calculated in the direction parallel to the first axis X, a distance between a second intersection point X2 and the surface of the target body may be 0.5. Since the second intersection point X2 is located within the surface of the target body, the distance value may have a negative sign. Thus, when calculated in the direction parallel to the first axis X, a distance value of the second intersection point X2 may be given as '−0.5'.

Similarly, distance values at third intersection point X3, fourth intersection point X4, fifth intersection point X5, sixth intersection point X6, seventh intersection point X7, and eighth intersection point X8 may be calculated as 0.5, −0.5, 0.5, −0.5, 0.5, and −0.5, respectively. When calculated in the direction parallel to the first axis X, each of distance values for intersection points, which are not located adjacent to the surface of the target body, may be given as a default value. An intersection point my be adjacent to the surface of the target body when the surface of the target body is between the intersection point and any adjacent intersection point. For example, a distance value for an intersection point, which is located within the target body and which is not adjacent to any surface of the target body, may be calculated as a negative default value. A distance value for an intersection point, which is located outside the target body and which is not adjacent to any surface of the target body, may be calculated as a positive default value. An absolute value of the default value may be greater than a maximum value of the range for the distance value. That is, when one of the point-based distance values is larger than a length of each grid, the one of the point-based distance values is given as a default value that is larger than a maximum value of a range of the distance values.

Figure 8:
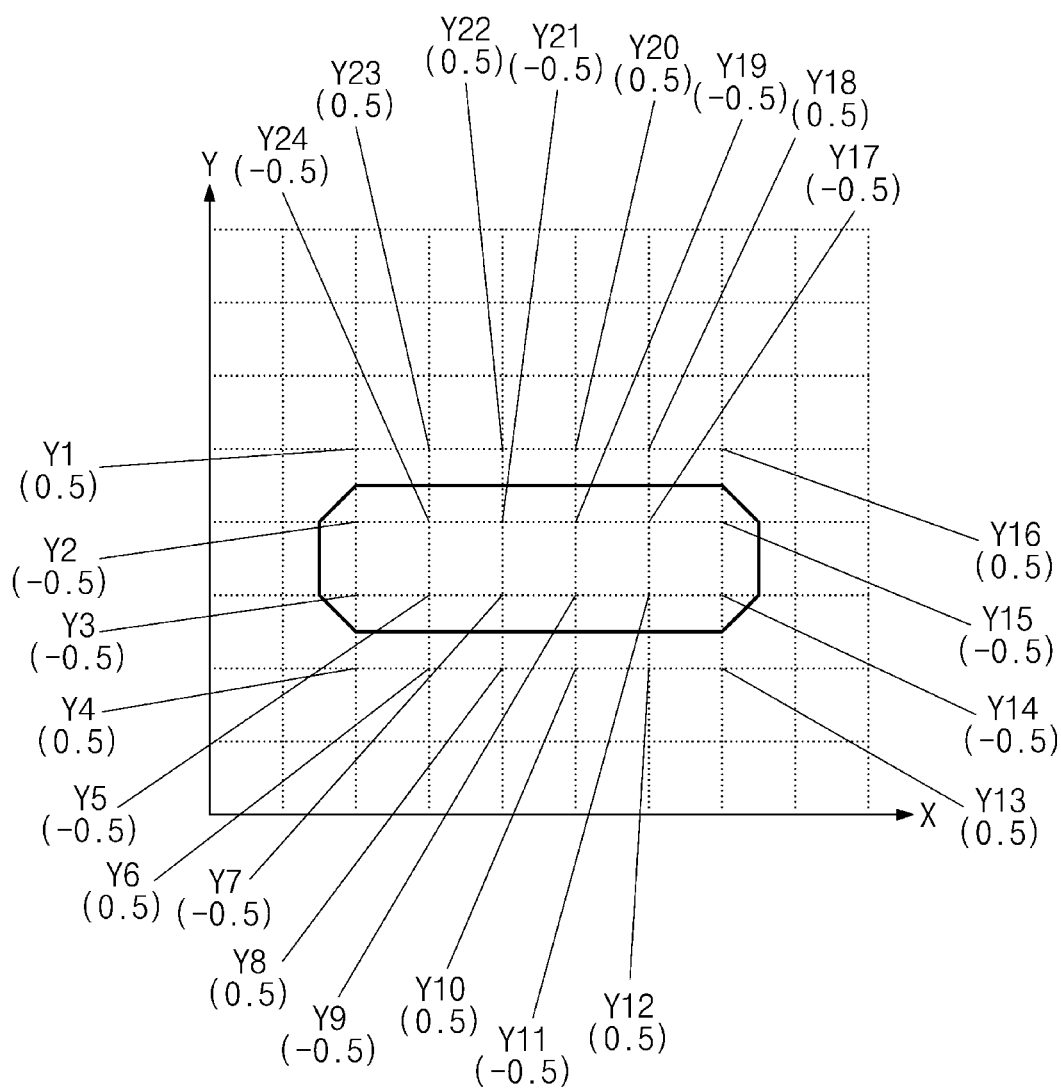
FIG. 8 illustrates distance values of intersection points that are exemplarily calculated in a direction of a second axis.

FIG. 8 illustrates distance values of intersection points that are exemplarily calculated in a direction of the second axis Y. Referring to FIG. 8, a distance between a first intersection point Y1 and the surface of the target body may be 0.5, when calculated in the direction parallel to the second axis Y. Since the first intersection point Y1 is located outside the surface of the target body, the distance value may have a positive sign. Thus, when calculated in the direction parallel to the second axis Y, a distance value of the first intersection point Y1 may be given as '0.5'.

When calculated in the direction parallel to the second axis Y, a distance between a second intersection point Y2 and the surface of the target body may be 0.5. Since the second intersection point Y2 is located within the surface of the target body, the distance value may have a negative sign. Thus, when calculated in the direction parallel to the second axis Y, a distance value of the second intersection point Y2 may be given as '−0.5'.

Similarly, distance values at third intersection point Y3 to twenty fourth intersection point Y24 may be calculated as −0.5, 0.5, −0.5, 0.5, −0.5, 0.5, −0.5, 0.5, −0.5, 0.5, 0.5, −0.5, −0.5, 0.5, −0.5, 0.5, −0.5, 0.5, −0.5, 0.5, 0.5, and −0.5, respectively.

When calculated in the direction parallel to the second axis Y, each of distance values for intersection points, which are not located adjacent to the surface of the target body, may be given as a default value. For example, a distance value for an intersection point, which is located within the target body and which is not adjacent to any surface of the target body, may be calculated as a negative default value. A distance value for an intersection point, which is located outside the target body and which is not adjacent to any surface of the target body, may be calculated as a positive default value.

Figure 9:
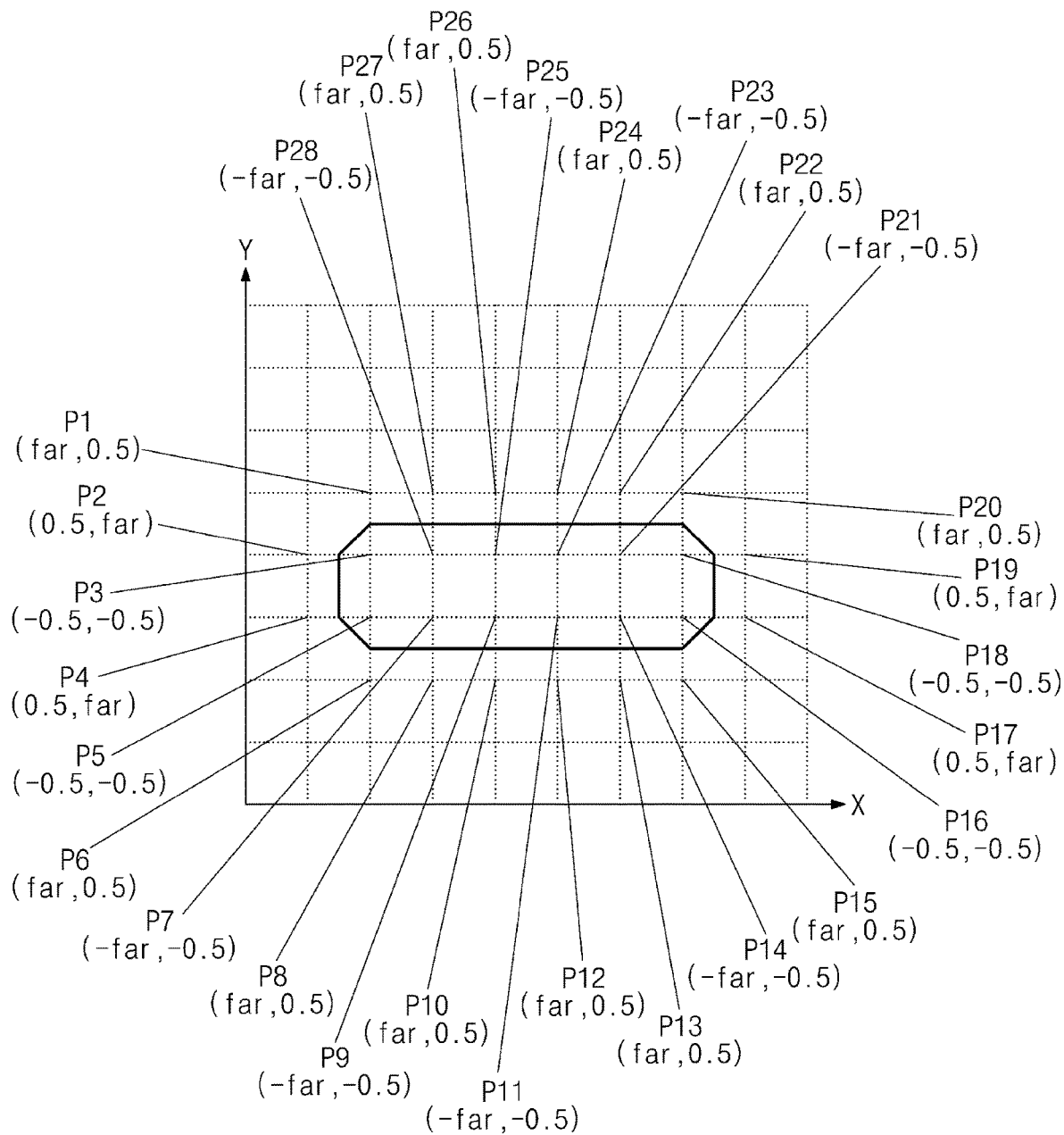
FIG. 9 illustrates an example of distance value sets calculated in FIGS. 7 and 8.

FIG. 9 illustrates an example of the distance value sets calculated in FIGS. 7 and 8. Referring to FIG. 9, the distance value sets, which are calculated, along the first axis X and the second axis Y, at intersection points adjacent to the surface of the target body, may be combined.

For a first intersection point P1, a distance value set may be (far, 0.5). The first intersection point P1 may have a distance value of a default value (i.e., far) along the first axis X and a distance value of 0.5 along the second axis Y. This represents that the first intersection point P1 is not adjacent to any surface of the target body and is located outside the target body in a direction of the first axis X and is apart from the target body by a distance of 0.5 and is located outside the target body in a direction of the second axis Y.

Similarly, second intersection point P2 to twenty-eighth intersection point P28 may have signed distance values shown in the following table labelled as Table 1.

TABLE 1

| Intersection Point | Distance Value | Intersection Point | Distance Value |
|---|---|---|---|
| P2 | (0.5, far) | P3 | (−0.5, −0.5) |
| P4 | (0.5, far) | P5 | (−0.5, −0.5) |
| P6 | (far, 0.5) | P7 | (−far, −0.5) |
| P8 | (far, 0.5) | P9 | (−far, −0.5) |
| P10 | (far, 0.5) | P11 | (−far, −0.5) |
| P12 | (far, 0.5) | P13 | (far, 0.5) |
| P14 | (−far, −0.5) | P15 | (far, 0,5) |
| P16 | (−0.5, −0.5) | P17 | (0.5, far) |
| P18 | (−0.5, −0.5) | P19 | (0.5, far) |
| P20 | (far, 0.5) | P21 | (−far, −0.5) |
| P22 | (far, 0.5) | P23 | (−far, −0.5) |
| P24 | (far, 0.5) | P25 | (−far, −0.5) |
| P26 | (far, 0.5) | P27 | (far, 0.5) |
| P28 | (−fat, −0.5) | | |

In FIGS. 7 to 9, each of distance values in each distance value set is described to have a sign. However, in an embodiment, each of distance values in each distance value set may be given as only a numerical value, without the sign. The sign of the distance value set may be uniquely determined depending on whether a selected intersection point is located within or outside the target body.

Similar to that described with reference to FIGS. 7 to 9, distance values may be calculated along the third axis Z. For example, signed distance values along the first axis X, the second axis Y, and the third axis Z may be calculated at intersection points adjacent to the target body.

Figure 10:
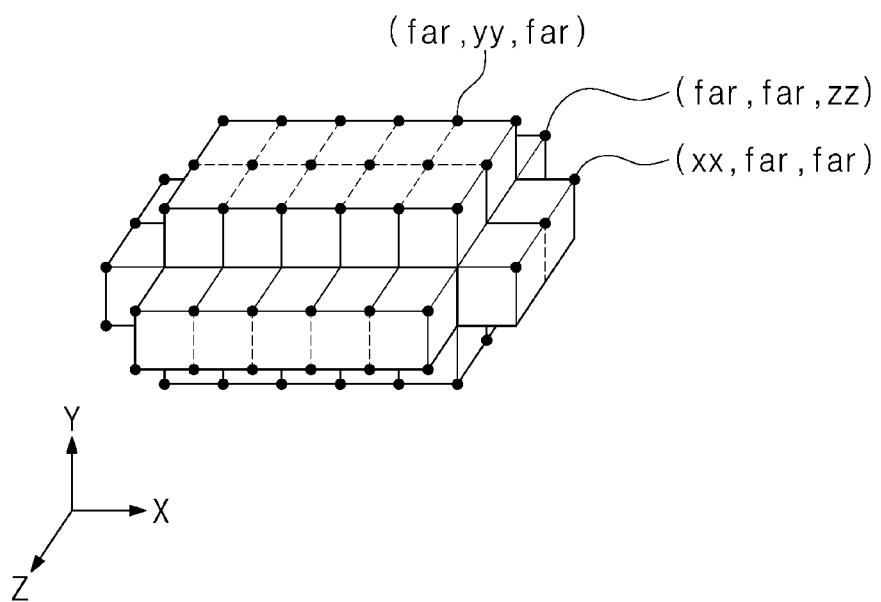
FIG. 10 illustrates signed distance values that are exemplarily calculated at intersection points located outside a target body.

FIG. 10 illustrates signed distance values that are exemplarily calculated at intersection points located outside the target body. Since the intersection point is located outside the target body, at least one of distance values for the intersection point may be given as the default value, as described with reference to FIGS. 6 to 9, though the default value may be given for an intersection point within the target body. Distance values or a distance value set (as a whole) for the intersection point may have a positive sign.

Figure 11:
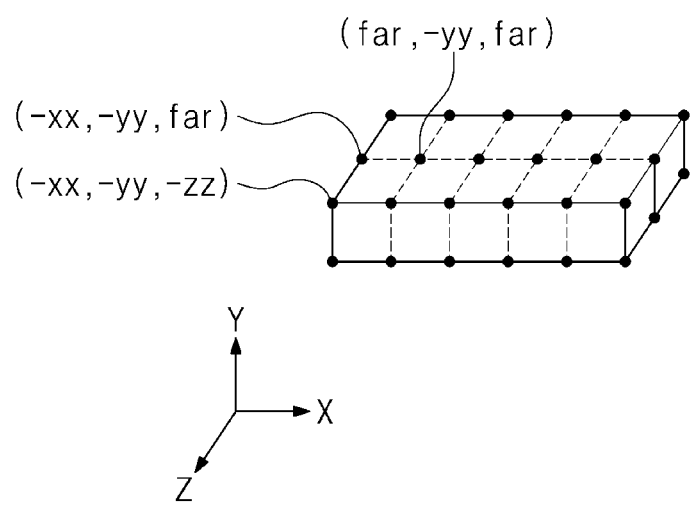
FIG. 11 illustrates signed distance values that are exemplarily calculated at intersection points located in the target body.

FIG. 11 illustrates signed distance values that are exemplarily calculated at intersection points located in the target body. Since an intersection point is located within the target body, at least one of distance values for the intersection point may have a meaningful value within the range, as described with reference to FIGS. 6 to 9, though a meaningful value may be given for an intersection point outside of the target value. Distance values or a distance value set (as a whole) for the intersection point may have a negative sign.

According to some embodiments of the present disclosure, a level set may include distance value sets associated with the target body, as described with reference to FIGS. 6 to 11. The distance value set may include distance values, and here, the number of the distance values constituting the distance value set may correspond to the dimension of the certain coordinate system. In other words, the polygon meshes representing the semiconductor model may be transformed to distance value sets including multi-dimensional distance values. Thus, it may be possible to depict the semiconductor model precisely and to prevent a distortion issue from occurring during the transformation process.

Figure 12:
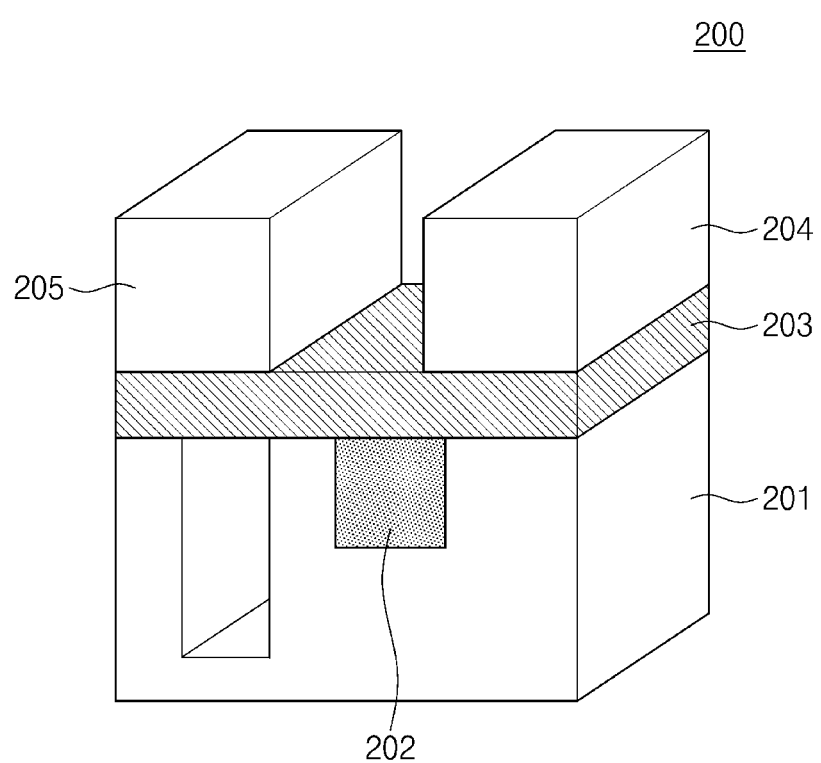
FIG. 12 illustrates an example of a semiconductor model defined by polygon meshes.

FIG. 12 illustrates an example of a semiconductor model 200 defined by polygon meshes. Referring to FIG. 12, the semiconductor model 200 may include a first body 201, a second body 202, a third body 203, a fourth body 204, and a fifth body 205. Surfaces of each of the first body 201, the second body 202, the third body 203, the fourth body 204 and the fifth body 205 may be defined by polygon meshes.

Figure 13:
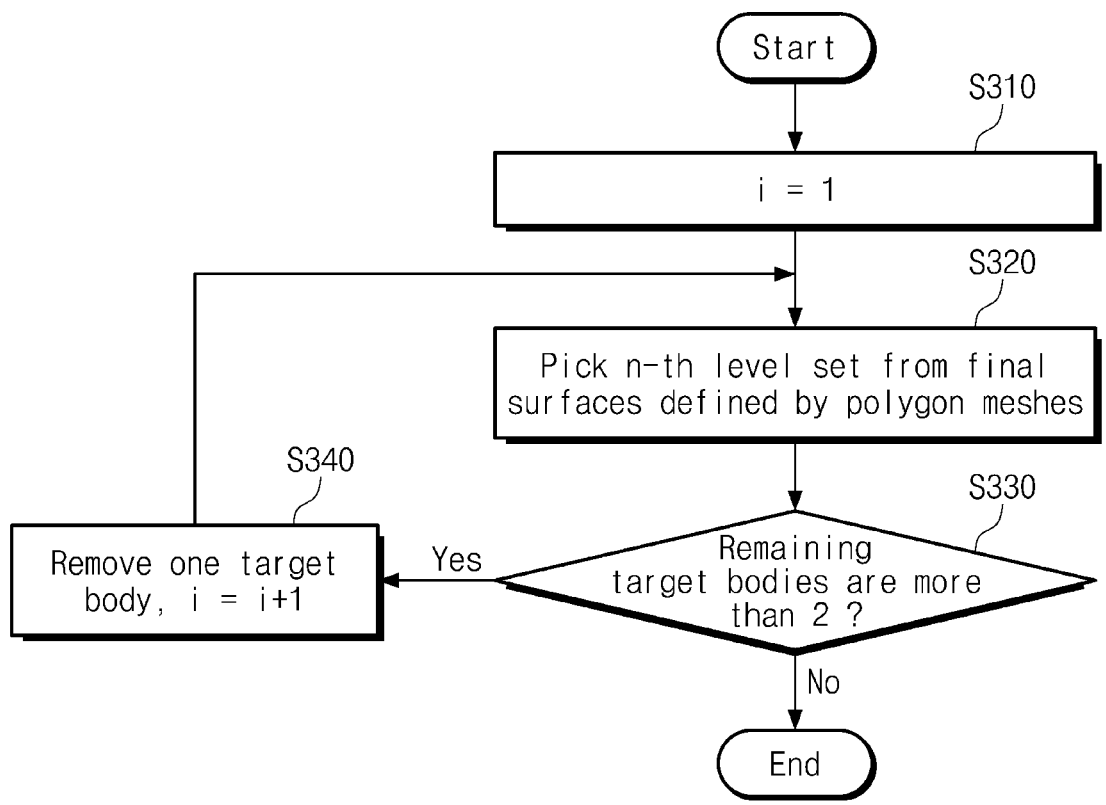
FIG. 13 is a flow chart illustrating an example of a method of transforming the polygon meshes in the semiconductor model of FIG. 12 into level sets.

FIG. 13 is a flow chart illustrating an example of a method of transforming the polygon meshes in the semiconductor model of FIG. 12 into level sets. The method shown in FIG. 13 may be performed by the simulation tool that is activated when the instructions 141 of the storage 140 are run by the processor 120 of FIG. 1. Referring to FIGS. 1 and 13, in step S310, the simulation tool may assign an initial value (e.g., 1) to a variable (i).

In step S320, the simulation tool may pick an n-th level set from final surfaces defined by the polygon meshes. The n-th level set may be picked in the context of S240 in FIG. 5, i.e., as a result of transformation of polygon meshes defining a surface of the semiconductor model into the n-th level set. The final surfaces may mean an outer surface of a semiconductor model. When surfaces of different bodies are in contact with each other and are not exposed to the outside, such surfaces may be excluded from the final surfaces.

In step S330, the simulation tool may examine whether two or more target bodies remain. Thereafter, a step S340 may be performed when the semiconductor model formed by the polygon meshes includes two or more bodies. In step S340, the simulation tool may remove one of the remaining target bodies and may increase the variable (i) by one.

The simulation tool may repeat the steps S320 to S340. In other words, the simulation tool may remove the target bodies one by one and may calculate level sets of final surfaces, which are formed by target bodies, after each removal process. If only one target body remains through the step S340, the step S320 may be performed to obtain a level set for the last target body. That is, when a number of a body remaining among the two or more bodies becomes one, the method for the semiconductor design simulation may include calculating a last set of the (first) level sets from surfaces formed by the remaining one body. Thereafter, in step S330, the simulation tool may terminate the process of transforming the polygon meshes to the level sets.

When the target body is transformed to the level sets, distortion may occur at edges of the target body. If first polygon meshes of the one target body are transformed to a level set and then the level set is transformed to second polygon meshes, at least one of the edges of the target body may have a distorted shape.

The simulation tool according to some embodiments of the present disclosure may calculate level sets of final surfaces of target bodies, instead of calculating level sets of each target body. Information on two or more target bodies may be contained in each level set. Thus, by comparing the level sets, it may be possible to detect distortion, which may occur during the transformation process, and to compensate the distortion.

Figure 14:
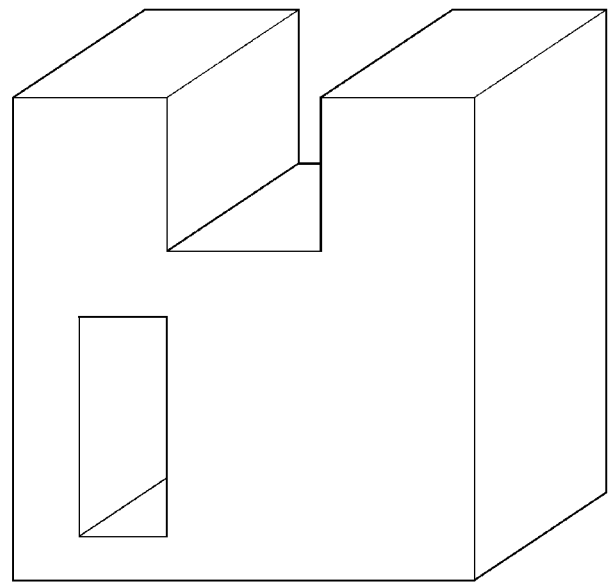
FIG. 14 illustrates an example of first final surfaces of the polygon meshes in the semiconductor model of FIG. 12.

FIG. 14 illustrates an example of first final surfaces 210 of the polygon meshes in the semiconductor model of FIG. 12. Referring to FIGS. 12 and 14, the first final surfaces 210 may include outer surfaces formed by the first body 201, the second body 202, the third body 203, the fourth body 204 and the fifth body 205. The simulation tool may calculate a first level set including distance value sets of distance values of intersection points from the first final surfaces 210.

Figure 15:
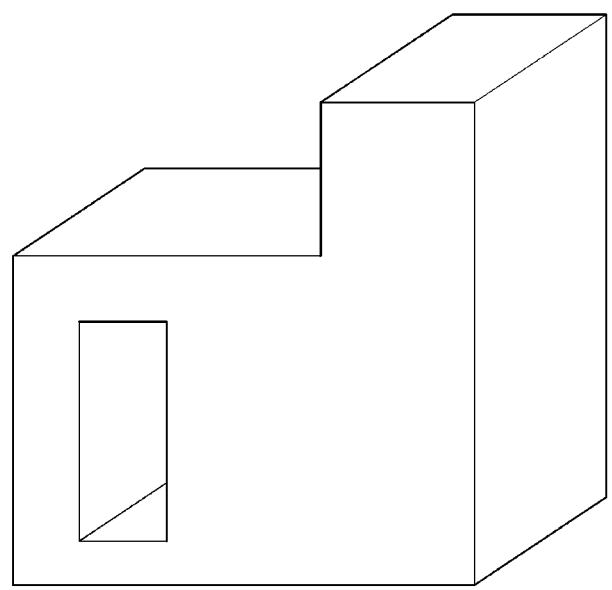
FIG. 15 illustrates an example of second final surfaces of polygon meshes that are obtained by removing a fifth body from the semiconductor model of FIG. 12.

FIG. 15 illustrates an example of second final surfaces 220 of polygon meshes that are obtained by removing the fifth body 205 from the semiconductor model of FIG. 12. Referring to FIGS. 12 and 15, the second final surfaces 220 may include outer surfaces formed by the first body 201, the second body 202, the third body 203 and the fourth body 204. The simulation tool may calculate a second level set including distance value sets of distance values of intersection points from the second final surfaces 220.

Figure 16:
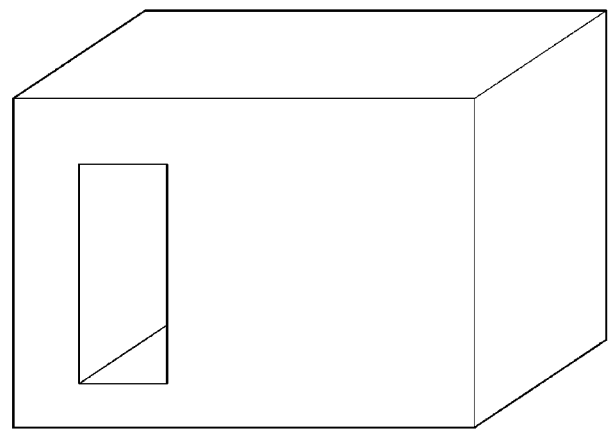
FIG. 16 illustrates an example of third final surfaces of polygon meshes that are obtained by removing a fourth body and a fifth body from the semiconductor model of FIG. 12.

FIG. 16 illustrates an example of third final surfaces 230 of polygon meshes that are obtained by removing the fourth body 204 and the fifth body 205 from the semiconductor model of FIG. 12. Referring to FIGS. 12 and 16, the third final surfaces 230 may include outer surfaces formed by the first body 201, the second body 202 and the third body 203. The simulation tool may calculate a third level set including distance value sets of distance values of intersection points from the third final surfaces 230.

Figure 17:
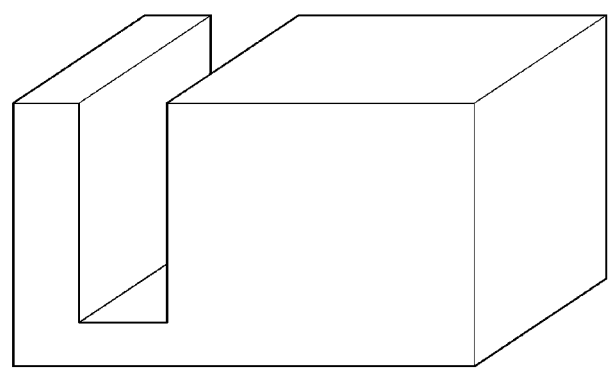
FIG. 17 illustrates an example of fourth final surfaces of polygon meshes that are obtained by removing a third body, a fourth body and a fifth body from the semiconductor model of FIG. 12.

FIG. 17 illustrates an example of fourth final surfaces 240 of polygon meshes that are obtained by removing the third body 203, the fourth body 204 and the fifth body 205 from the semiconductor model of FIG. 12. Referring to FIGS. 12 and 17, the fourth final surfaces 240 may include outer surfaces formed by the first body 201 and second body 202. The simulation tool may calculate a fourth level set including distance value sets of distance values of intersection points from the fourth final surfaces 240.

Figure 18:
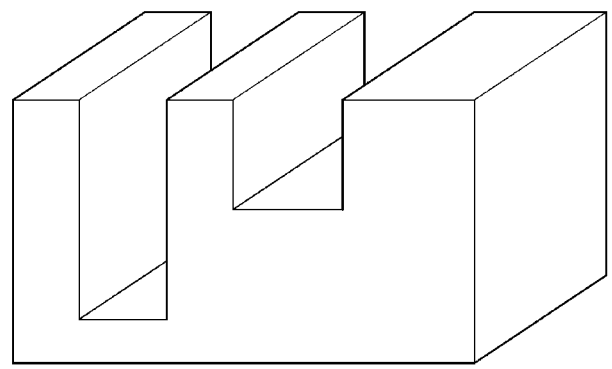
FIG. 18 illustrates an example of fifth final surfaces of polygon meshes that are obtained by removing a second body, a third body, a fourth body, and a fifth body from the semiconductor model of FIG. 12.

FIG. 18 illustrates an example of fifth final surfaces 250 of polygon meshes that are obtained by removing the second body 202, the third body 203, the fourth body 204 and the fifth body 205 from the semiconductor model of FIG. 12. Referring to FIGS. 12 and 18, the fifth final surfaces 250 may include outer surfaces formed by the first body 201. The simulation tool may calculate a fifth level set including distance value sets of distance values of intersection points from the fifth final surfaces 250.

Figure 19:
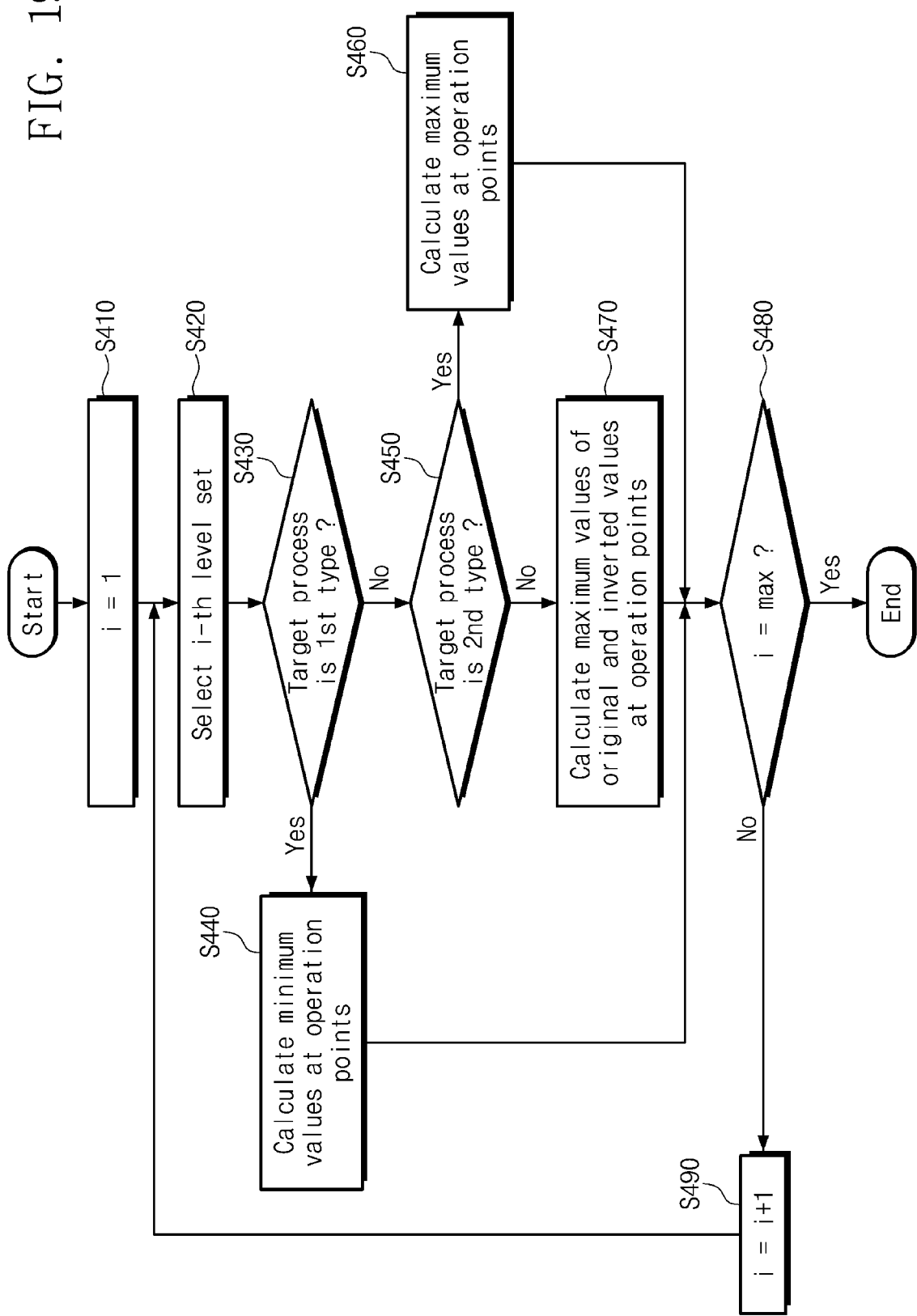
FIG. 19 is a flow chart illustrating an example of a method of performing a logical operation on a first level set, a second level set, a third level set, a fourth level set and a fifth level set described with reference to FIGS. 14 to 18.

FIG. 19 is a flow chart illustrating an example of a method of performing a logical operation on the first level set to the fifth level set described with reference to FIGS. 14 to 18. The method shown in FIG. 19 may be performed by the simulation tool that is activated when the instructions 141 of the storage 140 are run by the processor 120. Referring to FIGS. 1 and 19, in step S410, the simulation tool may assign an initial value (e.g., 1) to a variable (i).

In step S420, the simulation tool may select an i-th level set from the first level set to the fifth level set described with reference to FIGS. 14 to 18. In step S430, the simulation tool may examine whether the target process is a first-type process. For example, the first-type process may lead to an increase in size of the semiconductor model. The first-type process may be a deposition process of adding a new body.

If the target process is the first-type process, the simulation tool may calculate minimum values of distance values at operation points, in step S440. Here, the operation points may be intersection points of grids having distance values that are changed by a process.

As explained in the following paragraphs, logical operations may be or include one of union, intersection and difference. For example, the simulation tool may calculate a level set (e.g., a target level set) corresponding to final surfaces of the semiconductor model, after the process. The simulation tool may obtain an operation result through union of the i-th level set and the target level set.

If the target process is not the first-type process, the simulation tool may examine whether the target process is a second-type process, in step S450. For example, the second-type process may lead to a reduction in size of the semiconductor model. The second-type process may be an etching process of removing at least a portion of the first body 201, the second body 202, the third body 203, the fourth body 204 and the fifth body 205.

If the target process is the second-type process, the simulation tool may calculate maximum values of distance values at the operation points, in step S460. For example, the simulation tool may calculate a level set (e.g., a target level set) corresponding to final surfaces of the semiconductor model, after the process. The simulation tool may obtain an operation result through intersection of the i-th level sets and the target level set.

If the target process is not the second-type process, the simulation tool may determine that the target process is a third-type process. For example, the third-type process may remove a portion from the semiconductor model. The third-type process may be a patterning process of removing at least a portion of the first body 201, the second body 202, the third body 203, the fourth body 204 and the fifth body 205.

If the target process is the third-type process, the simulation tool may calculate minimum values of inverted values, which are obtained by inverting signs of distance values of the first level set to the fifth level set and distance values of the target level set, at the operation points, in step S470. For example, the simulation tool may calculate a level set (e.g., the target level set) corresponding to a shape, which is removed from the semiconductor model through the process. The simulation tool may obtain an operation result from a difference between the i-th level set and the target level set.

Accordingly, logical operations may be or include one of union, intersection and difference, depending on whether the process is the first-type, the second-type or the third-type described above.

If the operation result is obtained in step S440, S450, or S460, in step S480, the simulation tool may determine whether the variable (i) is the maximum value. For example, if the variable (i) reaches the number of level sets, the variable (i) may be the maximum value. If the variable (i) is not the maximum value, the simulation tool may increase the variable (i) by one, in step S490. Thereafter, the simulation tool may perform the step S420 again. If the variable (i) is the maximum value, the simulation tool may definitely determine level sets, on which the operation is finished, as final level sets.

As described above, the simulation tool may apply the same process to each of the first level set to the fifth level set. The process may work through a simple operation of selecting the minimum or maximum value of the distance values. Thus, it may be possible to reduce an amount of computation required for the CSG operation and to reduce an operation time for CSG operation.

Figure 20:
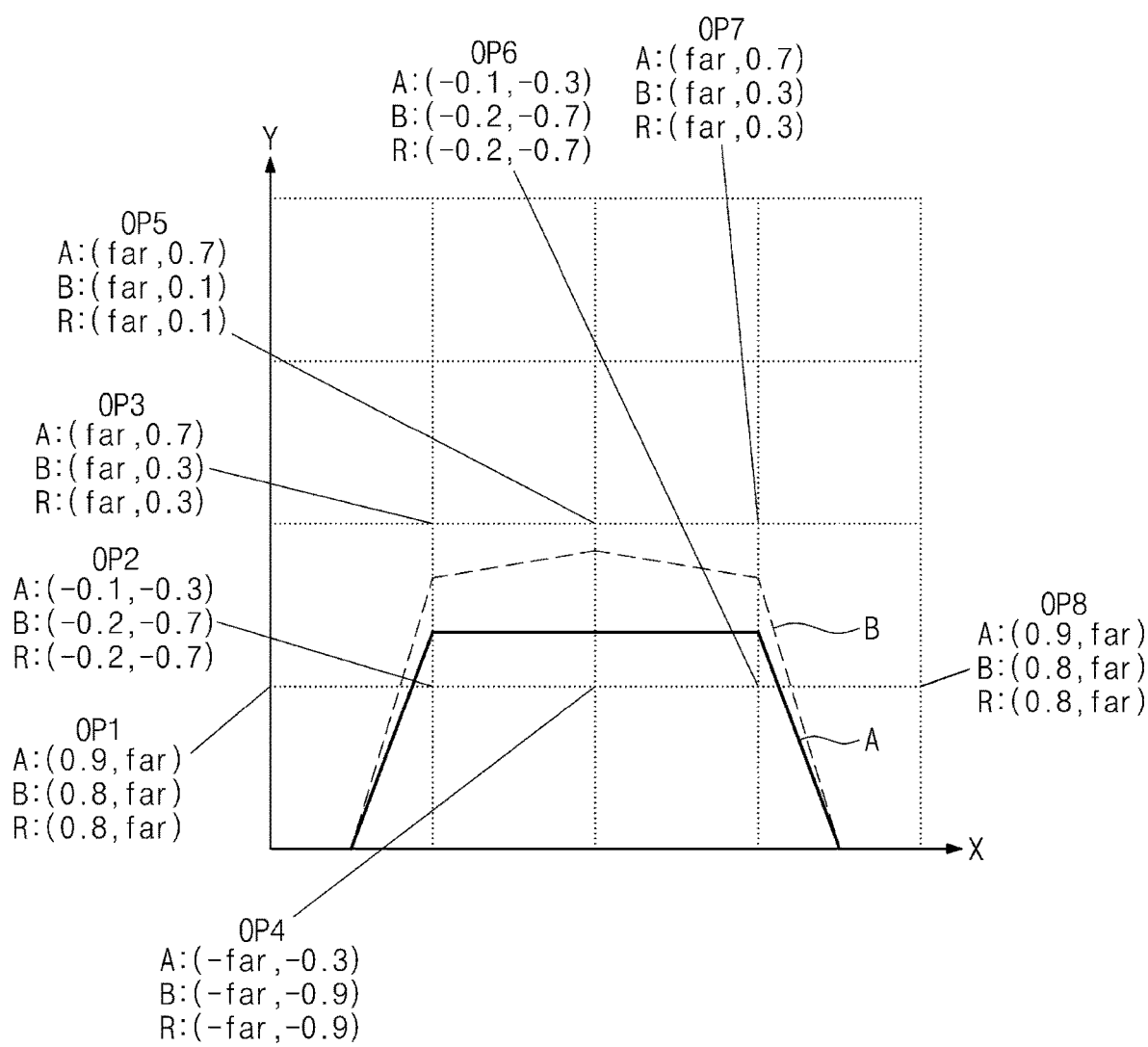
FIG. 20 illustrates an example of a first-type process applied to a semiconductor model.

FIG. 20 illustrates an example of a first-type process applied to a semiconductor model. In detail, FIG. 20 illustrates an example of the first-type process that is applied to a plane defined by, for example, the first axis X and the second axis Y. In FIG. 20, a shape of a semiconductor model is depicted by the solid line A, and a shape corresponding to a target level set is depicted by the dotted line B. If the first-type process is applied, the shape of the semiconductor model may be changed from that depicted by the solid line A to that depicted by the dotted line B.

At a first operation point OP1, the distance values to the solid line A may be (0.9, far). The distance values to the dotted line B may be (0.8, far). A result value R of the first operation point OP1 after the process may be 0.8, which is the minimum value in the direction of the first axis X, and 'far', which is the minimum value in the direction of the second axis Y.

At a second operation point OP2, the distance values to the solid line A may be (−0.1, −0.3). The distance values to the dotted line B may be (−0.2, −0.7). A result value R of the second operation point OP2 after the process may be '−0.2', which is the minimum value in the direction of the first axis X, and '−0.7', which is the minimum value in the direction of the second axis Y.

At a third operation point OP3, the distance values to the solid line A may be (far, 0.7). The distance values to the dotted line B may be (far, 0.3). A result value R of the third operation point OP3 after the process may be 'far', which is the minimum value in the direction of the first axis X, and '0.3', which is the minimum value in the direction of the second axis Y.

At a fourth operation point OP4, the distance values to the solid line A may be (−far, −0.3). The distance values to the dotted line B may be (−far, −0.9). A result value R of the fourth operation point OP4 after the process may be '−far', which is the minimum value in the direction of the first axis X, and '−0.9', which is the minimum value in the direction of the second axis Y.

At a fifth operation point OP5, the distance values to the solid line A may be (far, 0.7). The distance values to the dotted line B may be (far, 0.1). A result value R of the fifth operation point OP5 after the process may be 'far', which is the minimum value in the direction of the first axis X, and '0.1', which is the minimum value in the direction of the second axis Y.

At a sixth operation point OP6, the distance values to the solid line A may be (−0.1, −0.3). The distance values to the dotted line B may be (−0.2, −0.7). A result value R of the sixth operation point OP6 after the process may be '−0.2', which is the minimum value in the direction of the first axis X, and '−0.7', which is the minimum value in the direction of the second axis Y.

At a seventh operation point OP7, the distance values to the solid line A may be (far, 0.7). The distance values to the dotted line B may be (far, 0.3). A result value R of the seventh operation point OP7 after the process may be 'far', which is the minimum value in the direction of the first axis X, and '0.3', which is the minimum value in the direction of the second axis Y.

At an eighth operation point OP8, the distance values to the solid line A may be (0.9, far). The distance values to the dotted line B may be (0.8, far). A result value R of the eighth operation point OP8 after the process may be '0.8', which is the minimum value in the direction of the first axis X, and 'far', which is the minimum value in the direction of the second axis Y.

Figure 21:
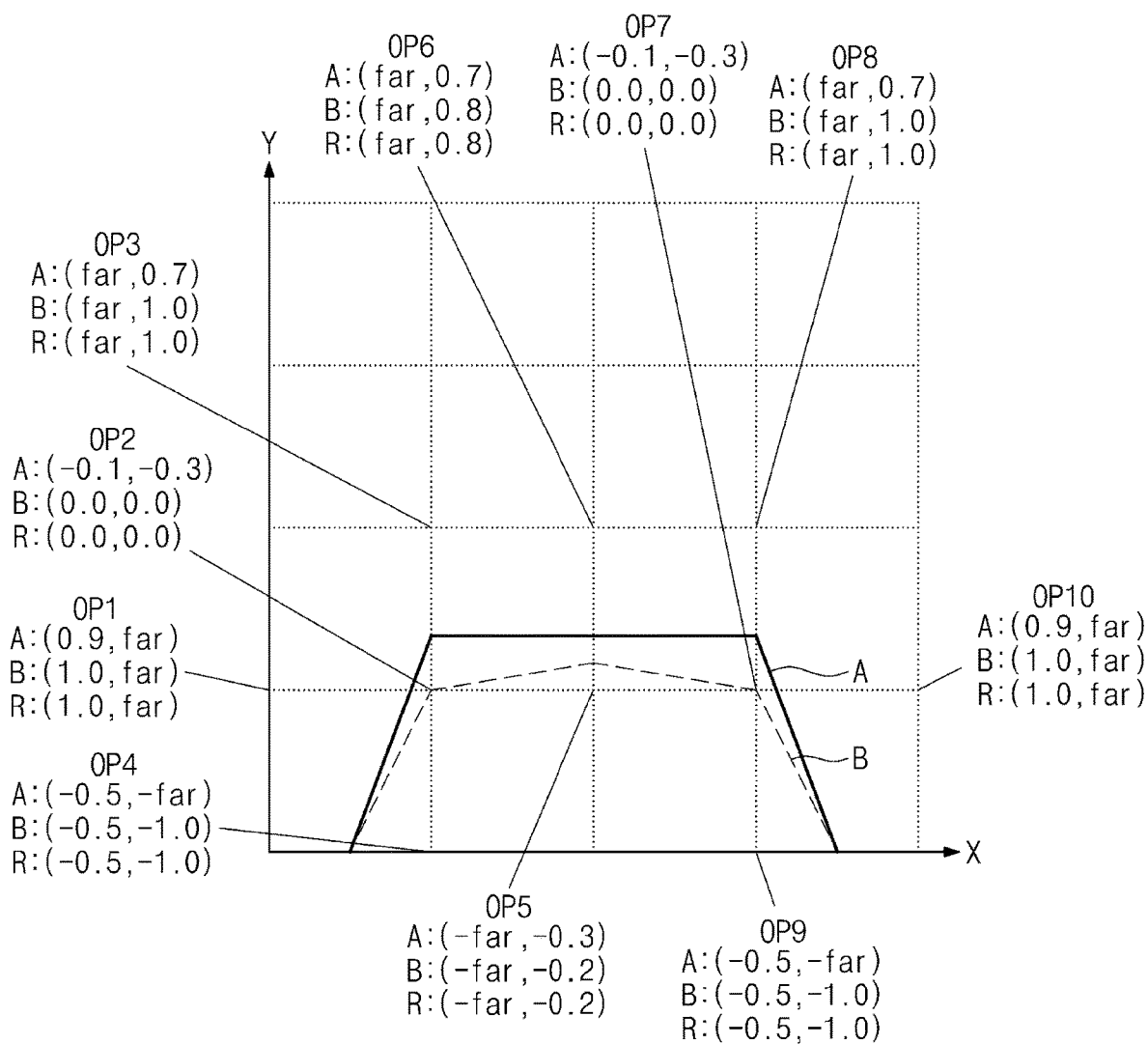
FIG. 21 illustrates an example of a second-type process applied to a semiconductor model.

FIG. 21 illustrates an example of a second-type process applied to a semiconductor model. In detail, FIG. 21 illustrates an example of second-type process that is applied to a plane defined by, for example, the first axis X and the second axis Y. In FIG. 21, a shape of a semiconductor model is depicted by the solid line A, and a shape corresponding to a target level set is depicted by the dotted line B. If the second-type process is applied, the semiconductor model of the shape may be changed from that depicted by the solid line A to that depicted by the dotted line B.

At a first operation point OP1, the distance values to the solid line A may be (0.9, far). The distance values to the dotted line B may be (1.0, far). A result value R of the first operation point OP1 after the process may be '1.0', which is the maximum value in the direction of the first axis X, and 'far', which is the maximum value in the direction of the second axis Y.

At a second operation point OP2, the distance values to the solid line A may be (−0.1, −0.3). The distance values to the dotted line B may be (0.0, 0.0). A result value R of the second operation point OP2 after the process may be '0.0', which is the maximum value in the direction of the first axis X, and '0.0', which is the maximum value in the direction of the second axis Y.

At a third operation point OP3, the distance values to the solid line A may be (far, 0.7). The distance values to the dotted line B may be (far, 1.0). A result value R of the third operation point OP3 after the process may be 'far', which is the maximum value in the direction of the first axis X, and '1.0', which is the maximum value in the direction of the second axis Y.

At a fourth operation point OP4, the distance values to the solid line A may be (−0.5, −far). The distance values to the dotted line B may be (−0.5, −1.0). A result value R of the fourth operation point OP4 after the process may be '−0.5', which is the maximum value in the direction of the first axis X, and '−1.0', which is the maximum value in the direction of the second axis Y.

At a fifth operation point OP5, the distance values to the solid line A may be (−far, −0.3). The distance values to the dotted line B may be (−far, −0.2). A result value R of the fifth operation point OP5 after the process may be '−far', which is the maximum value in the direction of the first axis X, and '−0.2', which is the maximum value in the direction of the second axis Y.

At a sixth operation point OP6, the distance values to the solid line A may be (far, 0.7). The distance values to the dotted line B may be (far, 0.8). A result value R of the sixth operation point OP6 after the process may be 'far', which is the maximum value in the direction of the first axis X, and '0.8', which is the maximum value in the direction of the second axis Y.

At a seventh operation point OP7, the distance values to the solid line A may be (−0.1, −0.3). The distance values to the dotted line B may be (0.0, 0.0). A result value R of the seventh operation point OP7 after the process may be '0.0', which is the maximum value in the direction of the first axis X, and '0.0', which is the maximum value in the direction of the second axis Y.

At an eighth operation point OP8, the distance values to the solid line A may be (far, 0.7). The distance values to the dotted line B may be (far, 1.0). A result value R of the eighth operation point OP8 after the process may be 'far', which is the maximum value in the direction of the first axis X, and '1.0', which is the maximum value in the direction of the second axis Y.

At a ninth operation point OP9, the distance values to the solid line A may be (−0.5, −far).

The distance values to the dotted line B may be (−0.5, −1.0). A result value R of the ninth operation point OP9 after the process may be '−0.5', which is the maximum value in the direction of the first axis X, and '−1.0', which is the maximum value in the direction of the second axis Y.

At a tenth operation point OP10, the distance values to the solid line A may be (0.9, far). The distance values to the dotted line B may be (1.0, far). A result value R of the tenth operation point OP10 after the process may be '1.0', which is the maximum value in the direction of the first axis X, and 'far', which is the maximum value in the direction of the second axis Y.

Figure 22:
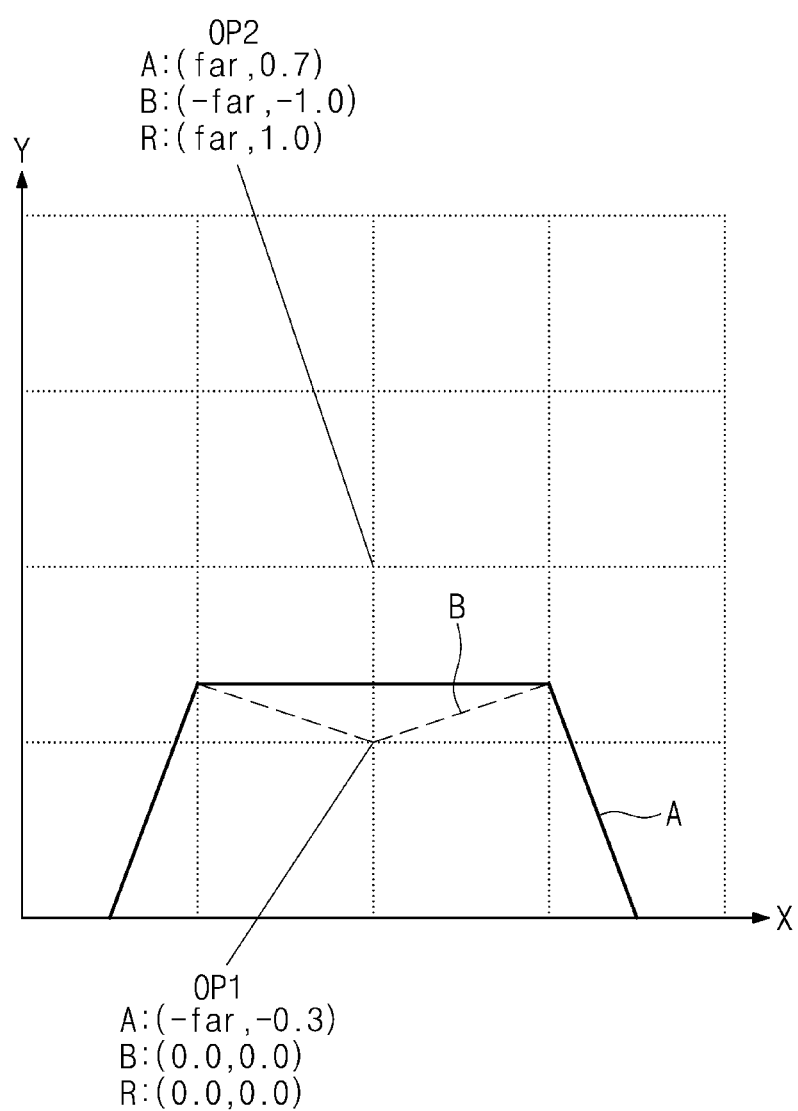
FIG. 22 illustrates an example of a third-type process applied to a semiconductor model.

FIG. 22 illustrates an example of a third-type process applied to a semiconductor model. In detail, FIG. 22 illustrates an example of the third-type process that is applied to a plane defined by, for example, the first axis X and the second axis Y. In FIG. 22, a shape of a semiconductor model is depicted by the solid line A, and a shape corresponding to a target level set is depicted by the dotted line B. If the third-type process is applied, the shape of the semiconductor model may be changed from that depicted by the solid line A to that depicted by the dotted line B.

At a first operation point OP1, the distance values to the solid line A may be (−far, −0.3). The distance values to the dotted line B may be (−far, 0.0). The inverted values of the distance values to the dotted line B may be (far, 0.0). A result value R of the first operation point OP1 after the process may be 'far', which is the maximum value in the direction of the first axis X, and '0.0', which is the maximum value in the direction of the second axis Y.

At a second operation point OP2, the distance values to the solid line A may be (far, 0.7). The second operation point OP2 may be positioned within a region, which is removed from the semiconductor model, and may be understood as being positioned within the target level set. Thus, at the second operation point OP2, the distance values to the dotted line B may be (−far, −1.0). The inverted values of the distance values to the dotted line B may be (far, 1.0). A result value R of the second operation point OP2 after the process may be 'far', which is the maximum value in the direction of the first axis X, and '1.0', which is the maximum value in the direction of the second axis Y.

The operations associated with the three different processes have been exemplarily described with reference to FIGS. 19 to 22. However, the present disclosure is not limited to the operations associated with the three different processes. The present disclosure may be applied to various other processes and various other operations associated therewith.

Figure 23:
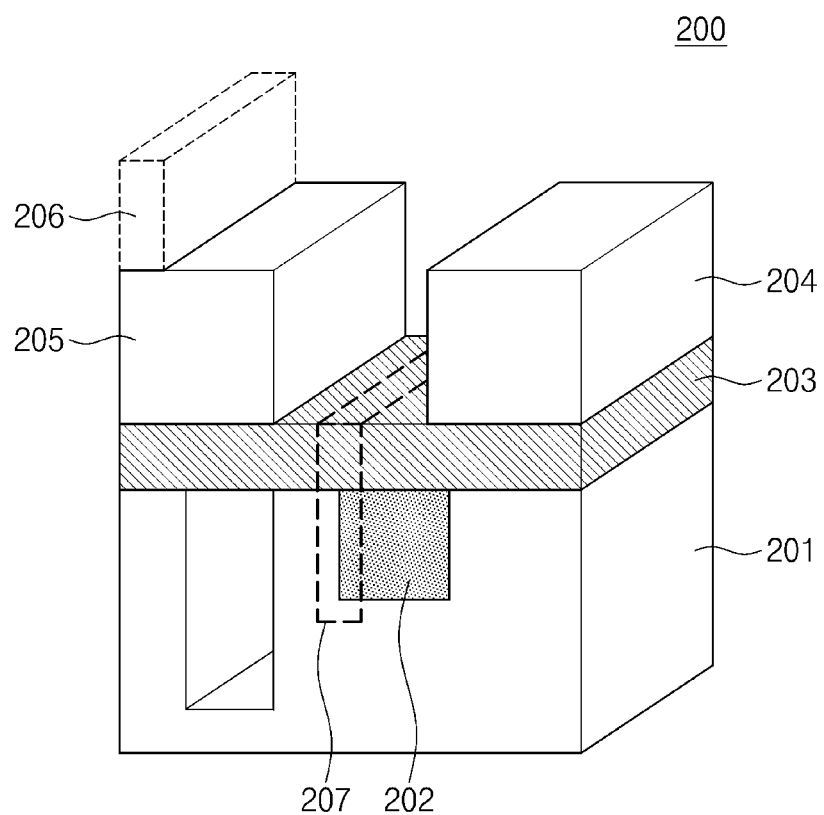
FIG. 23 illustrates an example of a process applied to the semiconductor model of FIG. 12.

FIG. 23 illustrates an example of a process applied to the semiconductor model of FIG. 12. Referring to FIG. 23, a sixth body 206 may be added through a first process. A seventh body 207 may be removed through a second process or a third process. In an embodiment, a process of adding the sixth body 206 and a process of removing the seventh body 207 may be performed sequentially or simultaneously.

Figure 24:
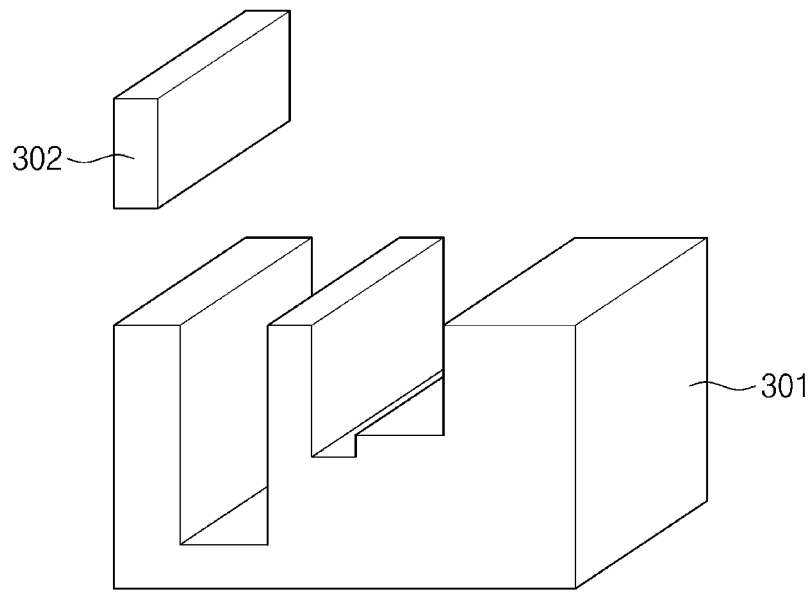
FIG. 24 illustrates an example of a first model that is obtained by adding a sixth body to and removing a seventh body from surfaces corresponding to the fifth level set of FIG. 18.

FIG. 24 illustrates a first model 310 that is obtained by adding the sixth body 206 to and removing the seventh body 207 from the surfaces corresponding to the fifth level set of FIG. 18. If the logical operations described with reference to FIGS. 19 to 22 are performed on the fifth level set, the resultant level set may represent the shape of the first model 310 shown in FIG. 24.

A first body 301 and a second body 302, after the process, may be identified from the first model 310. For example, the first body 301 and the second body 302 may be identified by generating polygon meshes from a level set representing the first body 301 and the second body 302.

Figure 25:
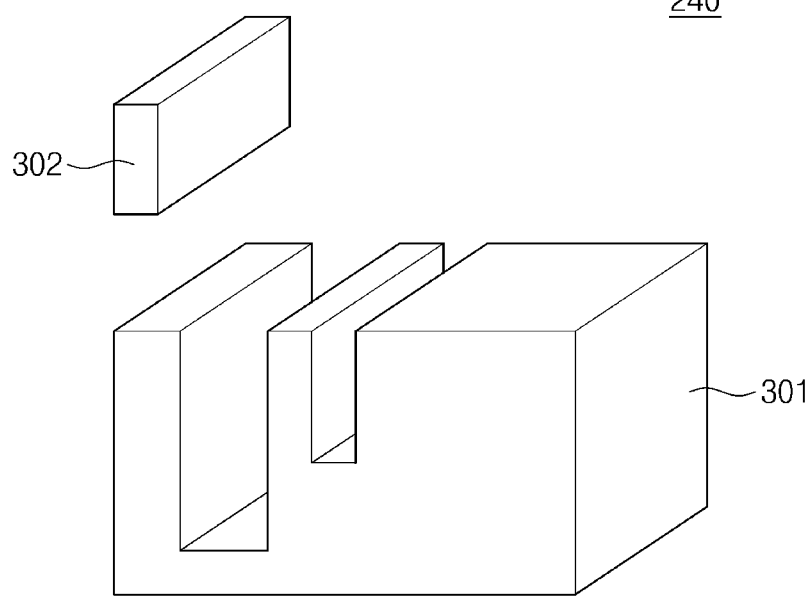
FIG. 25 illustrates an example of a first model that is obtained by adding a sixth body to and removing a seventh body from surfaces corresponding to the fourth level set of FIG. 17.

FIG. 25 illustrates a shape 240' that is obtained by adding the sixth body 206 to and removing the seventh body 207 from the surfaces corresponding to the fourth level set of FIG. 17. If the logical operations described with reference to FIGS. 19 to 22 are performed on the fourth level set, the resultant level set may represent the shape of the shape 240' shown in FIG. 25. The additional body may be identified by comparing the shape 240' of FIG. 25 with the first model 310 obtained from FIG. 24.

Figure 26:
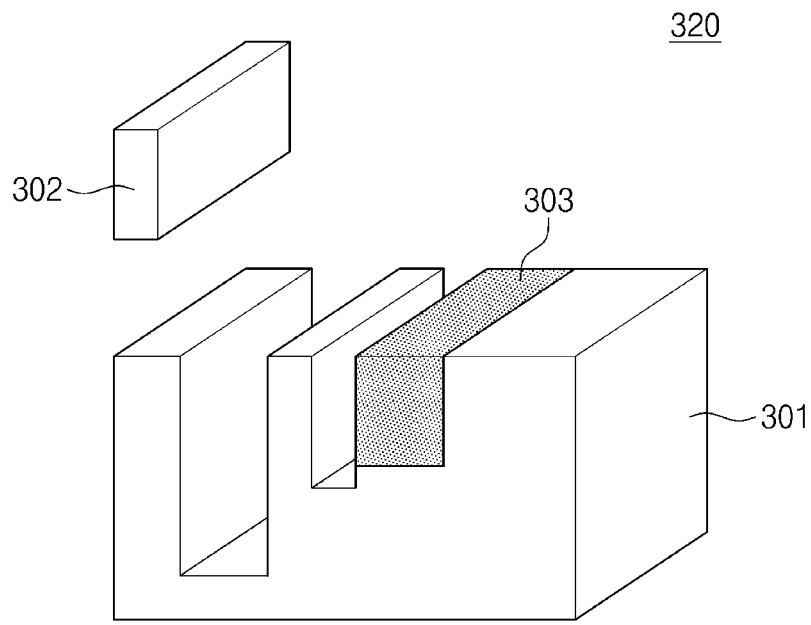
FIG. 26 illustrates an example of a second model, in which a third body is additionally identified after a process.

FIG. 26 illustrates an example of a second model 320, in which a third body 303 is additionally identified after a process. The comparison between the first model 310 of FIG. 24 and the shape 240' of FIG. 25 shows that there is a difference at portions corresponding to the third body 303 and there is no difference at the remaining portions. Thus, the different portions may be identified as the third body 303. The third body 303 may be identified by generating polygon meshes from distance value sets representing the different portions.

Figure 27:
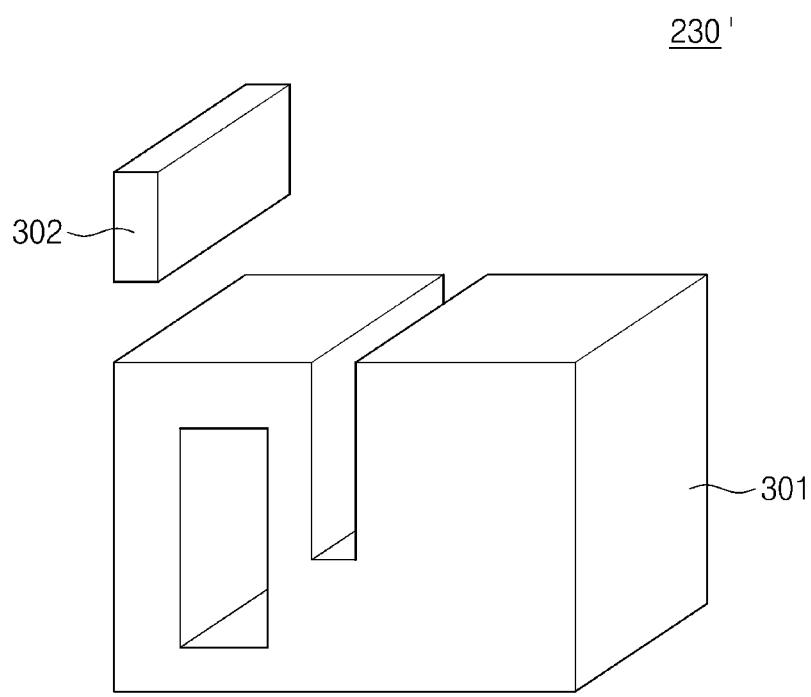
FIG. 27 illustrating a shape that is obtained by adding a sixth body to and removing a seventh body from surfaces corresponding to the third level set of FIG. 16.

FIG. 27 illustrates a shape 230' that is obtained by adding the sixth body 206 to and removing the seventh body 207 from the surfaces corresponding to the third level set of FIG. 16. If the logical operations described with reference to FIGS. 19 to 22 are performed on the third level set, the resultant level set may represent the shape of the shape 230' shown in FIG. 27. The additional body may be identified by comparing the shape 230' of FIG. 27 with the second model 320 obtained from FIG. 26.

Figure 28:
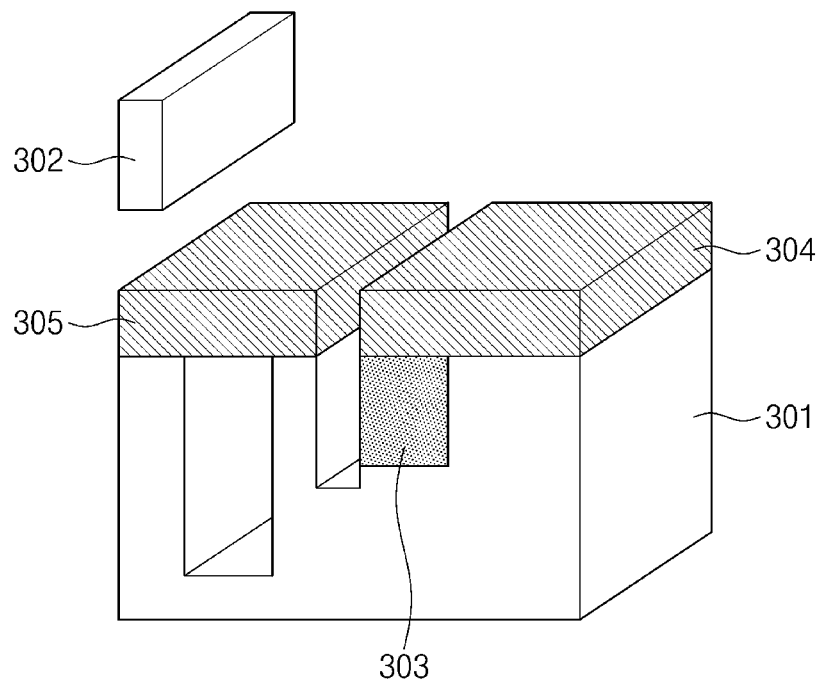
FIG. 28 illustrates an example of a third model, in which a fourth body and a fifth body are additionally identified after a process.

FIG. 28 illustrates an example of a third model 330, in which a fourth body 304 and a fifth body 305 are additionally identified after a process. The comparison between the second model 320 of FIG. 26 and the shape 230' of FIG. 27 shows that there is a difference at portions corresponding to the fourth body 304 and the fifth body 305 and there is no difference at the remaining portions. Thus, the different portions may be identified as the fourth body 304 and the fifth body 305, respectively. The fourth body 304 and the fifth body 305 may be identified by generating polygon meshes from distance value sets representing the different portions.

Figure 29:
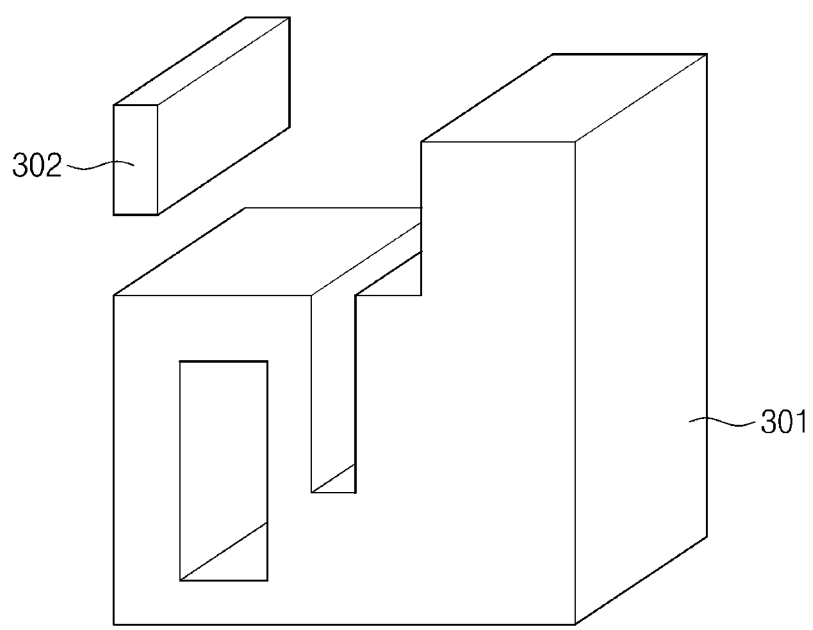
FIG. 29 illustrating a shape that is obtained by adding a sixth body to and removing a seventh body from surfaces corresponding to the second level set of FIG. 15.

FIG. 29 illustrates a shape 220' that is obtained by adding the sixth body 206 to and removing the seventh body 207 from the surfaces corresponding to the second level set of FIG. 15. If the logical operations described with reference to FIGS. 19 to 22 are performed on the second level set, the resultant level set may represent the shape of the shape 220' shown in FIG. 29. The additional body may be identified by comparing the shape 220' of FIG. 29 with the third model 330 obtained from FIG. 28.

Figure 30:
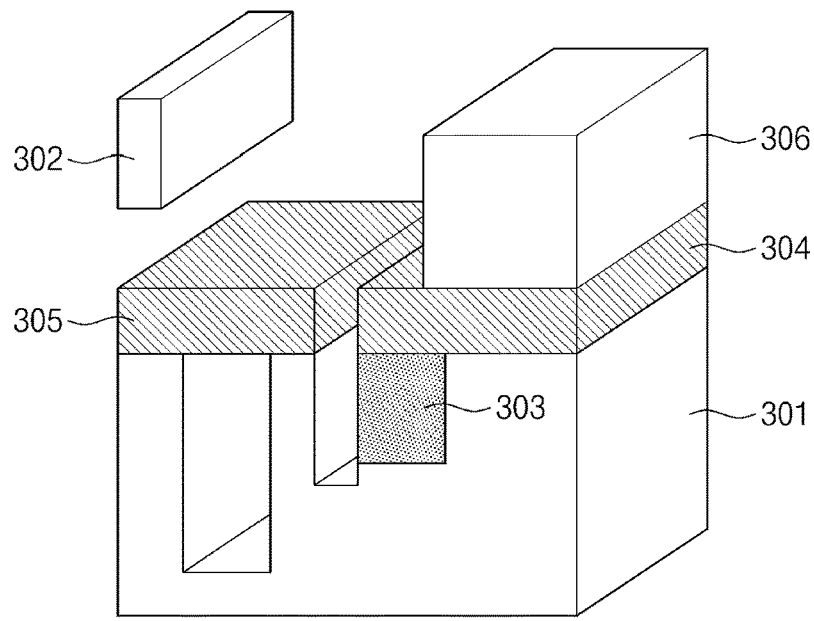
FIG. 30 illustrates an example of a fourth model, in which a sixth body is additionally identified after a process.

FIG. 30 illustrates an example of a fourth model 340, in which a sixth body 306 is additionally identified after a process. The comparison between the third model 330 of FIG. 28 and the shape 220' of FIG. 29 shows that there is a difference at portions corresponding to the sixth body 306 and there is no difference at the remaining portions. Thus, the different portions may be identified as the sixth body 306. The sixth body 306 may be identified by generating polygon meshes from distance value sets representing the different portions.

Figure 31:
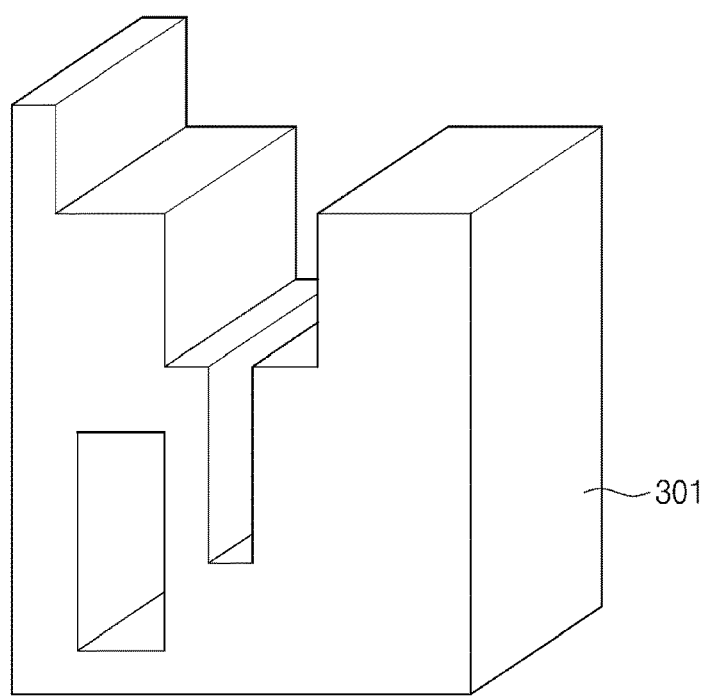
FIG. 31 illustrating a shape that is obtained by adding a sixth body to and removing a seventh body from surfaces corresponding to the first level set of FIG. 14.

FIG. 31 illustrates a shape 210' that is obtained by adding the sixth body 206 to and removing the seventh body 207 from the surfaces corresponding to the first level set of FIG. 14. If the logical operations described with reference to FIGS. 19 to 22 are performed on the first level set, the resultant level set may represent the shape of the shape 210' shown in FIG. 31. The additional body may be identified by comparing the shape 210' of FIG. 31 with the fourth model 340 obtained from FIG. 30.

Figure 32:
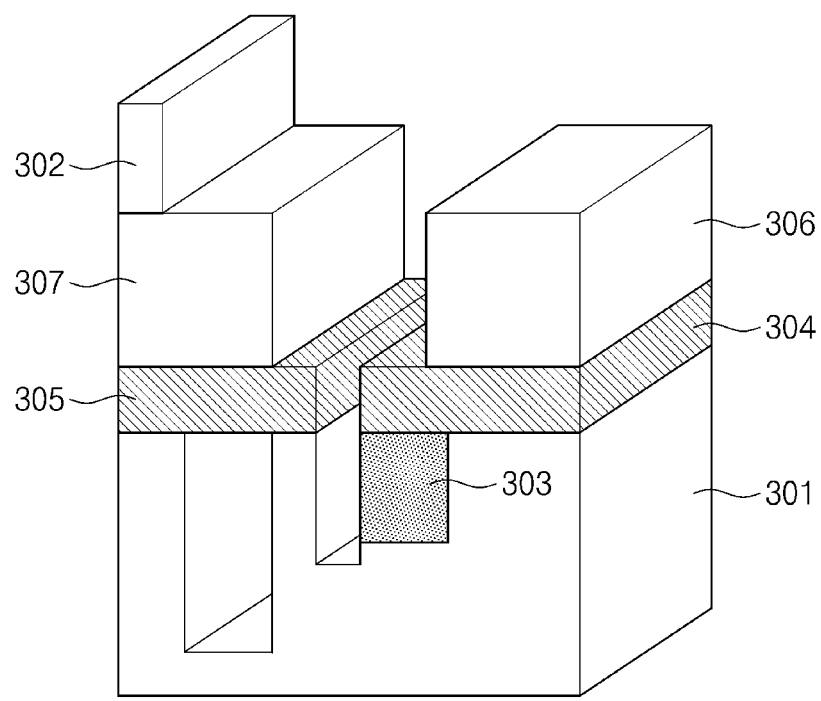
FIG. 32 illustrates an example of a fifth model, in which a seventh body is additionally identified after a process.

FIG. 32 illustrates an example of a fifth model 350, in which a seventh body 307 is additionally identified after a process. The comparison between the fourth model 340 of FIG. 30 and the shape 210' of FIG. 31 shows that there is a difference at portions corresponding to the seventh body 307 and there is no difference at the remaining portions. Thus, the different portions may be identified as the seventh body 307. The seventh body 307 may be identified by generating polygon meshes from distance value sets representing the different portions.

As described above, according to some embodiments of the present disclosure, a process on a semiconductor model may be performed through a logical operation of selecting a maximum or minimum value. Thus, it is always possible to successfully generate polygon meshes, after the process, regardless of a degree of complexity of the semiconductor model.

In addition, since there is no need to consider consistency between polygon meshes when the logical operation is performed, a degree of complexity of the operation may be linearly proportional to the number of the polygon meshes. This may make it possible to easily realize a parallelization and to easily distribute operations to multicores.

According to some embodiments of the present disclosure, an error in the logical operation may be dependent on errors in values treated at the grids, independent of complexity of the polygon meshes or complexity of surfaces formed by the polygon meshes. Thus, it may be possible to reduce an operation error, compared to when the operation is directly performed on the polygon meshes.

According to some embodiments of the present disclosure, if, when a logical operation is performed, a difference between a first distance value of a level set and a second distance value of a target level set is smaller than a threshold value, a simulation tool is configured to fixedly select the first distance value or the second distance value. For example, when a difference between the first distance value and the second distance value is smaller than the threshold value, one distance value of the first distance value and the second distance value may be fixedly calculated as the distance value of the second level set. Thus, fluctuation in shape may be easily corrected with a small computation amount.

Additionally, though the teachings of the present disclosure are described in the context of semiconductor design, any resultant semiconductor design may be produced in a corresponding fabrication. Accordingly, a method of fabricating a semiconductor may start with or otherwise include the method for semiconductor design simulation described herein. Additionally, a system for fabricating a semiconductor may include the semiconductor design system 100, so that the fabricated semiconductors are fabricated in accordance with the results of the semiconductor design simulation described herein.

Some examples of a simulation tool associated with designing a semiconductor device are described in the afore-described embodiments. However, the present disclosure is not limited to the design of the semiconductor device and can be applied to various designs or modeling processes.

In the above-described embodiments, components according to embodiments of the present disclosure are referred to by using the term "block". The "block" may be implemented with hardwares, such as an integrated circuit (IC), an application specific IC (ASIC), a field programmable gate array (FPGA), and a complex programmable logic device (CPLD), softwares, such as firmwares and applications driven in hardware devices, or combinations of hardware and software. In addition, the "block" may include circuits or intellectual property (IP) arrangements (e.g., unique arrangements of elements protected or protectable by intellectual property), which are implemented with semiconductor devices in an IC.

According to some embodiments of the present disclosure, an operation, which is performed on polygon meshes in the CSG operation, may be replaced with an operation on values. In this case, a degree of complexity in the operation is reduced, and thus, it may be possible to reduce an amount of computation required for the operation. Accordingly, it may be possible to simulate a design of a semiconductor device in a reduced operation time. As a result, it may be possible to provide a storage medium which stores instructions for such a fast simulation, a semiconductor design system including the storage medium, and a method of simulation a design of a semiconductor device using the system.

While example embodiments of the present disclosure have been particularly shown and described, it will be understood by one of ordinary skill in the art that variations in form and detail may be made therein without departing from the spirit and scope of the attached claims.

What is claimed is:

1. A method of fabricating a semiconductor, the method comprising:
   simulating one semiconductor process of a plurality of semiconductor processes performed on a semiconductor model, comprising:
   generating first polygon meshes which define final surfaces of at least one semiconductor model;
   converting the first polygon meshes to first level sets, the first level sets comprising n level sets, wherein the converting comprises repeatedly selecting a level set until selecting an nth level set, the level sets excluding surfaces of different bodies of the at least one semiconductor model in contact with one another;
   performing a logical operation on the first level sets to generate second level sets, the logical operation corresponding to the one semiconductor process and being selected from a plurality of logical operations corresponding to the plurality of semiconductor processes; and converting the second level sets to second polygon meshes; and fabricating the semiconductor using a result of the simulating, wherein the converting of the first polygon meshes to the first level sets comprises:

constructing grids in a certain coordinate system to allow a target body, which is formed by the first polygon meshes, to be placed in grids;

calculating distance values at selected intersection points, which are positioned adjacent to surfaces of the target body, among intersection points of the grids; and picking the distance values as one set of the first level sets, wherein, in each of the intersection points, partial distance values corresponding to each of a number axis of the certain coordinate system are calculated as a portion of the distance values, and wherein the distance values comprise point-based distance values, which are obtained at a specific intersection point, and wherein, based on a first point-based distance value, among the point-based distance values, being larger than a length of each grid, the first point-based distance value is assigned a default value that is larger than a maximum value of a range of the distance values.

2. The method of claim 1, wherein the distance values comprise point-based distance values, which are obtained at each of the selected intersection points.

3. The method of claim 1, wherein the selected intersection points comprise first intersection points, which are positioned outside the surfaces of the target body, and second intersection points, which are positioned within the surfaces of the target body.

4. The method of claim 3, wherein each of the distance values at the first intersection points has a positive sign, and each of the distance values at the second intersection points has a negative sign.

5. The method of claim 1, wherein the distance values represent shortest distances from the specific intersection point to the surfaces of the target body in the certain coordinate system.

6. The method of claim 1, wherein, when the first polygon meshes form two or more bodies, the converting of the first polygon meshes to the first level sets comprises calculating a first set of the first level sets from first final surfaces formed by the two or more bodies.

7. The method of claim 6, wherein the converting of the first polygon meshes to the first level sets further comprises:

removing one of the two or more bodies, and calculating a second set of the first level sets from second final surfaces formed by remaining bodies.

8. The method of claim 7, wherein, when only one body remains as a remaining one body among the two or more bodies, the method further comprises calculating a last set of the first level sets from surfaces formed by the remaining one body.

9. The method of claim 8, wherein the plurality of logical operations are executed on the first set, the second set, and the last set, respectively, of the first level sets.

10. The method of claim 1, wherein each of the plurality of logical operations comprises one of union, intersection, and difference.

11. The method of claim 1, wherein the plurality of logical operations are performed on the first level sets and a target level set.

12. The method of claim 11, wherein each of the first level sets comprises first distance value sets, the target level set comprises second distance value sets, and the performing of the plurality of logical operations on the first level sets comprises calculating a minimum or maximum value, which is selected from a specific first distance value of the first distance value sets of a specific first level set of the first level sets and a specific second distance value of the second distance value sets associated with the specific first distance value, as a distance value of a specific second level set of the second level sets corresponding to the specific first level set.

13. The method of claim 12, wherein when a difference between the specific first distance value and the specific second distance value is smaller than a threshold value, one distance value of the specific first distance value and the specific second distance value is fixedly calculated as the distance value of the specific second level set.

14. The method of claim 1, wherein the converting of the second level sets to the second polygon meshes comprises:

calculating surfaces from the second level sets, respectively;

identifying bodies from the surfaces as identified bodies based on differences between the surfaces; and generating the second polygon meshes in the identified bodies.

15. The method of claim 1, wherein the second polygon meshes are independent of the first polygon meshes.

16. A semiconductor fabrication system, comprising:

a simulator comprising a memory that stores instructions and a processor configured to execute the instructions to perform a semiconductor process simulation of a plurality of semiconductor process simulations on a semiconductor model, the semiconductor process simulation comprising:

generating first polygon meshes which define final surfaces of at least one semiconductor model;

converting the first polygon meshes to first level sets, the first level sets comprising n level sets, wherein the converting comprises repeatedly selecting a level set until selecting an nth level set, the level sets excluding surfaces of different bodies of the at least one semiconductor model in contact with one another;

performing a logical operation on the first level sets to generate second level sets, the logical operation corresponding to the semiconductor process simulation and being selected from a plurality of logical operations corresponding to the plurality of semiconductor process simulations; and converting the second level sets to second polygon meshes, wherein a result of the semiconductor process simulation is used to fabricate a semiconductor, wherein the converting of the first polygon meshes to the first level sets comprises:

constructing grids in a certain coordinate system to allow a target body, which is formed by the first polygon meshes, to be placed in grids;

calculating distance values at selected intersection points, which are positioned adjacent to surfaces of the target body, among intersection points of the grids; and picking the distance values as one set of the first level sets, and wherein, in each of the intersection points, partial distance values corresponding to each of a number axis of the certain coordinate system are calculated as a portion of the distance values, wherein the distance values comprise point-based distance values, which are obtained at a specific intersection point, and wherein, based on a first point-based distance value, among the point-based distance values, being larger than a length of each grid, the first point-based distance value is assigned a default value that is larger than a maximum value of a range of the distance values.

17. The semiconductor fabrication system of claim 16, wherein each of the first level sets comprises first distance value sets, each of the first distance value sets comprises a plurality of distance values, and each of the distance values has a positive or negative sign, and wherein a number of the distance values in each of the first distance value sets is equal to a dimension of a certain coordinate system, in which the first distance value sets are generated.

18. A method of fabricating a semiconductor, the method comprising:

simulating one semiconductor process of a plurality of semiconductor processes performed on a semiconductor model, comprising:

forming a first body and a second body using first polygon meshes which define final surfaces of the semiconductor model;

calculating a first level set from first surfaces formed by the first body and the second body, the first level set being selected from n level sets in an iterative process until an nth level set level set is selected, the level sets excluding surfaces of different bodies of the semiconductor model in contact with one another;

removing the first body to generate second polygon meshes;

calculating a second level set from a second surface of the second body;

performing a logical operation on the first level set and the second level set to generate a third level set, the logical operation corresponding to the one semiconductor process and being selected from a plurality of logical operations corresponding to the plurality of semiconductor processes; and generating third polygon meshes from the third level set; and fabricating the semiconductor using a result of the simulating, wherein the calculating the first level set comprises:

constructing grids in a certain coordinate system to allow the first body and the second body to be placed in grids;

calculating distance values at selected intersection points, which are positioned adjacent to surfaces of the first body and the second body, among intersection points of the grids; and picking the distance values as the first level set, wherein, in each of the intersection points, partial distance values corresponding to each of a number axis of the certain coordinate system are calculated as a portion of the distance values, wherein the distance values comprise point-based distance values, which are obtained at a specific intersection point, and wherein, based on a first point-based distance value, among the point-based distance values, being larger than a length of each grid, the first point-based distance value is assigned a default value that is larger than a maximum value of a range of the distance values.

19. The method of claim 18, wherein the simulating further comprises:

generating the third polygon meshes to form the first body, from a difference between the second level set and the first level set.

* * * * *